(12) United States Patent  (10) Patent No.: US 7,565,588 B2
Nakashima et al.  (45) Date of Patent: Jul. 21, 2009

(54) SEMICONDUCTOR DEVICE AND DATA STORAGE APPARATUS

(75) Inventors: Katsuya Nakashima, Nagasaki (JP); Kazuhiro Suzuki, Kanagawa (JP); Satoshi Yamakawa, Tokyo (JP); Toshiyuki Nishihara, Kanagawa (JP); Yukihisa Tsuneda, Kanagawa (JP)

(73) Assignee: Sony Corporation (JP)

( * ) Notice: Subject to any disclaimer, the term of this patent is extended or adjusted under 35 U.S.C. 154(b) by 368 days.

(21) Appl. No.: 11/607,029

(22) Filed: Dec. 1, 2006

(65) Prior Publication Data

US 2007/0130488 A1  Jun. 7, 2007

(30) Foreign Application Priority Data

Dec. 7, 2005 (JP) ............................. P2005-354063
May 17, 2006 (JP) ............................. P2006-138120

(51) Int. Cl.
*G11C 29/00* (2006.01)
*G01R 31/28* (2006.01)

(52) U.S. Cl. ....................................... 714/718; 714/726

(58) Field of Classification Search ........................ None
See application file for complete search history.

(56) References Cited

U.S. PATENT DOCUMENTS 6,421,789 B1 *  7/2002  Ooishi ............................ 714/7
7,420,695 B2 *  9/2008  Kawabata et al. .......... 358/1.15
7,461,242 B2 * 12/2008  Grossman et al. ........... 712/228

FOREIGN PATENT DOCUMENTS

JP  6-290585  10/1994

* cited by examiner

*Primary Examiner*—Christine T Tu
(74) *Attorney, Agent, or Firm*—Rader Fishman & Grauer PLLC; Ronald P. Kananen

(57) ABSTRACT

A semiconductor device and a data storage apparatus are provided. A semiconductor device includes: a cell array configured to have cells for data storage arranged in an array; at least one buffer configured to latch read data of the cell array in units of pages; an output circuit configured to output read data; and a data transfer circuit configured to sequentially transfer read data in units of pages latched in the buffer to the output circuit, wherein the data transfer circuit includes: at least one layer of a scan register train including a plurality of serially connected scan registers having a register and a multiplexer connected to each other to operate for each of clocks, wherein an output of the multiplexer is connected to an input of a register, and an input of a multiplexer is connected to an output of a register in a next previous stage.

27 Claims, 35 Drawing Sheets

SEMICONDUCTOR DEVICE AND DATA STORAGE APPARATUS

CROSS REFERENCES TO RELATED APPLICATIONS

The present invention contains subject matter related to Japanese Patent Applications JP2005-354063 and JP 2006-138120 filed in the Japanese Patent Office on Dec. 7, 2005 and May 17, 2006, respectively, the entire contents of which being incorporated herein by reference.

BACKGROUND OF THE INVENTION

1. Field of the Invention

The present invention relates to a semiconductor device and a data storage apparatus, which include a data transfer circuit which can be used in a semiconductor element configured to have a cell array structure like a flash memory and an image sensor in which a large volume of data is read or written sequentially at high speed.

2. Description of the Related Art

In a flash memory nowadays, units for read and write operations are as great as 16 Kbit, and it takes time to some extent for an operation to read data out of an array and to transfer the data to an input/output circuit of a chip.

FIG. 1 shows a diagram depicting an exemplary configuration of a circuit system to transfer data from a cell array to an input/output circuit in a typical flash memory (semiconductor device).

A flash memory 1 shown in FIG. 1 has a cell array 2, a sense amplifier group 3, a page buffer 4 configured to have latches arranged in parallel, a column switch group 5, a sense amplifier 6, and an input/output circuit 7.

In the case of the flash memory, as shown in FIG. 1, data transfer from the cell array 2 to the input/output circuit 7 on a chip was conducted in such a way that switches SW for the number of necessary items of data are simply connected to data lines DL and the potential on the data lines DL is sensed. For example, when the page size is 512 bytes that is the unit of reading data in the flash memory, 512 transistors are connected to a single data line DL, signals corresponding to data logic 0/1 are outputted to the data line DL, and the signals are amplified by the sense amplifier 6 on the input/output circuit for data transfer.

In this case, generally, the length of the data line DL is as long as a few mm, and a large number of transistors as many as 512 transistors is connected. Therefore, the delay time of the data line becomes a bottleneck, causing difficulties of high speed data transfer. At the product level, the cycle time is about 25 ns.

In addition, nowadays, page size is increased from 512 bytes to 2 K bytes and further to 4 K bytes, the delay time on the data line DL becomes a greater problem.

In order to transfer data at high speed in this basic structure, such a scheme is known that data lines are provided in two system lines and the two groups of data lines are operated alternately. However, in this scheme, the cycle time can be reduced by half, but this does not make a drastic solution.

On the other hand, when data in the array structure is read sequentially, such a scheme is known that data is temporarily held on registers serially connected and clocks are supplied to the registers to transfer data sequentially as shift registers do (for example, see JP-A-6-290585 (Patent Reference 1)).

In this scheme, since the cycle time for data transfer is basically decided by the delay time for a single register, significantly high speed data transfer is made possible.

SUMMARY OF THE INVENTION

However, in an apparatus disclosed in Patent Reference 1, registers are provided by the number of items of data equivalent to twice as many as a single word or the number of data lines, and all the registers are operated in synchronization with clocks.

Like a flash memory, when a large number of devices are used in a single chip, it is necessary to reduce current consumption as much as possible. Therefore, it is necessary to reduce current consumption more than the scheme disclosed in Patent Reference 1 does.

In addition, in the flash memory, it is necessary to read only data in a spare area within a page, and it is also desired to cope therewith.

Thus, it is desirable to provide a semiconductor device and a data storage apparatus in which when a large volume of data on a cell array is basically, serially read or written, data can be transferred at high speed with small current consumption.

A semiconductor device according to a first embodiment of the invention is a semiconductor device including: a cell array configured to have cells for data storage arranged in an array; at least one buffer configured to latch read data of the cell array in units of pages; an output circuit configured to output read data; and a data transfer circuit configured to sequentially transfer read data in units of pages latched in the buffer to the output circuit, wherein the data transfer circuit includes: at least one layer of a scan register train which includes a plurality of scan registers serially connected, wherein the scan register has a register and a multiplexer connected to each other, and the scan register is operated at every clock, wherein an output of the multiplexer is connected to an input of the register, and an input of the multiplexer is connected to an output of a register at a next previous stage.

Preferably, the semiconductor device includes: a plurality of layers of the scan register trains, wherein a last output of a lower scan register train is connected to one input of a relevant multiplexer in a scan register train in a layer one layer above, the other input of a multiplexer in a scan register train in the lowermost layer is connected to a data output line of the buffer, and an output of the uppermost scan register train is connected to an input of the output circuit.

Preferably, in the semiconductor device, instead of a scan register train in a given layer, a multiplexer having multiple inputs is arranged.

Preferably, in the semiconductor device, a multiplexer is arranged at an output part of a scan register at the last stage in a scan register train, one input of the multiplexer is connected to an output of the scan register at the last stage in the scan register train, and the other input thereof is connected to an output of a scan register at a forward stage more than the last stage in the scan register train.

Preferably, the semiconductor device includes: a control part configured to control whether to drive a clock for the scan register at each of the lower scan register trains, and to control a multiplexer in an upper scan register train so as to take an output of a lower scan register in the upper scan register train.

A semiconductor device according to a second embodiment of the invention is a semiconductor device including: a cell array configured to have cells for data storage arranged in an array; at least one buffer configured to latch write data of the cell array in units of pages; an input circuit configured to input write data; and a data transfer circuit configured to sequentially transfer write data inputted in the input circuit to the buffer, wherein the data transfer circuit includes: a plurality of layers of register train having a plurality of registers serially connected, wherein an output of each of the registers in an upper register train is connected to an input of a lower register train.

Preferably, in the semiconductor device, instead of a register train in a given layer, a multi-output demultiplexer is arranged.

Preferably, in the semiconductor device, a multiplexer is inserted into the midway of a register train, one input of the multiplexer is connected to an output of a register at a stage before the stage at which the multiplexer is inserted in the register train, and the other input thereof is connected to an input part of the register train.

Preferably, the semiconductor device includes: a control part configured to control whether to drive a clock for the register at each of the lower layer register trains.

A semiconductor device according to a third embodiment of the invention is a semiconductor device including: a cell array configured to have cells for data storage arranged in an array; at least a single buffer configured to latch read data and write data of the cell array in units of pages; an input/output circuit configured to output read data and to input write data; and a data transfer circuit configured to sequentially transfer read data in units of pages latched in the buffer to the input/output circuit and to sequentially transfer write data inputted in the input/output circuit to the buffer, wherein the data transfer circuit includes: a plurality of layers of scan register train which includes a plurality of scan registers in which a register and a multiplexer are connected to each other and are operated for each of clocks, wherein the plurality of the scan registers is serially connected, an output of the multiplexer is connected to an input of a register, an input of the multiplexer is connected to an output of a register in a next previous stage, and a last output of a lower scan register train is connected to one input of a relevant multiplexer in a scan register train in a layer one layer above, and one input of a multiplexer at a first stage in a lower scan register train is connected to an output of a relevant register in a scan register train in a layer one layer above.

A data storage apparatus according to a fourth embodiment of the invention is a data storage apparatus including: a main storage medium configured to include a semiconductor device; and a control circuit configured to store in the semiconductor device a data block in which internally created management data is added to user data received from a host, wherein the semiconductor device of the main storage medium includes: a cell array configured to have cells for data storage arranged in an array; at least one buffer configured to latch read data of the cell array in units of pages; an output circuit configured to output read data; and a data transfer circuit configured to sequentially transfer read data in units of pages latched in the buffer to the output circuit, the data transfer circuit includes: a plurality of layers of scan register train which includes a plurality of scan registers serially connected, wherein the scan register has a register and a multiplexer connected to each other, and the scan register is operated at every clock, wherein an output of the multiplexer is connected to the resister, an input of the multiplexer is connected to an output of a register in a next previous stage, a last output of a lower scan register train is connected to one input of a relevant multiplexer in a scan register train in a layer one layer above, the other input of a multiplexer in a scan register train in the lowermost layer is connected to a data output line of the buffer, and an output of a scan register train in the uppermost layer is connected to an input of the output circuit, wherein a data block having management data added is read as a sequential word train out of the semiconductor memory, and in the data block, at least one part of the management data is arranged in an area in which the management data is outputted earlier than the user data is outputted.

According to an embodiment of the invention, when a large volume of data on a cell array is basically, serially read or written, data can be transferred at high speed with small current consumption.

DETAILED DESCRIPTION OF THE INVENTION

Hereinafter, an embodiment of the invention will be described with reference to the drawings.

Figure 1:
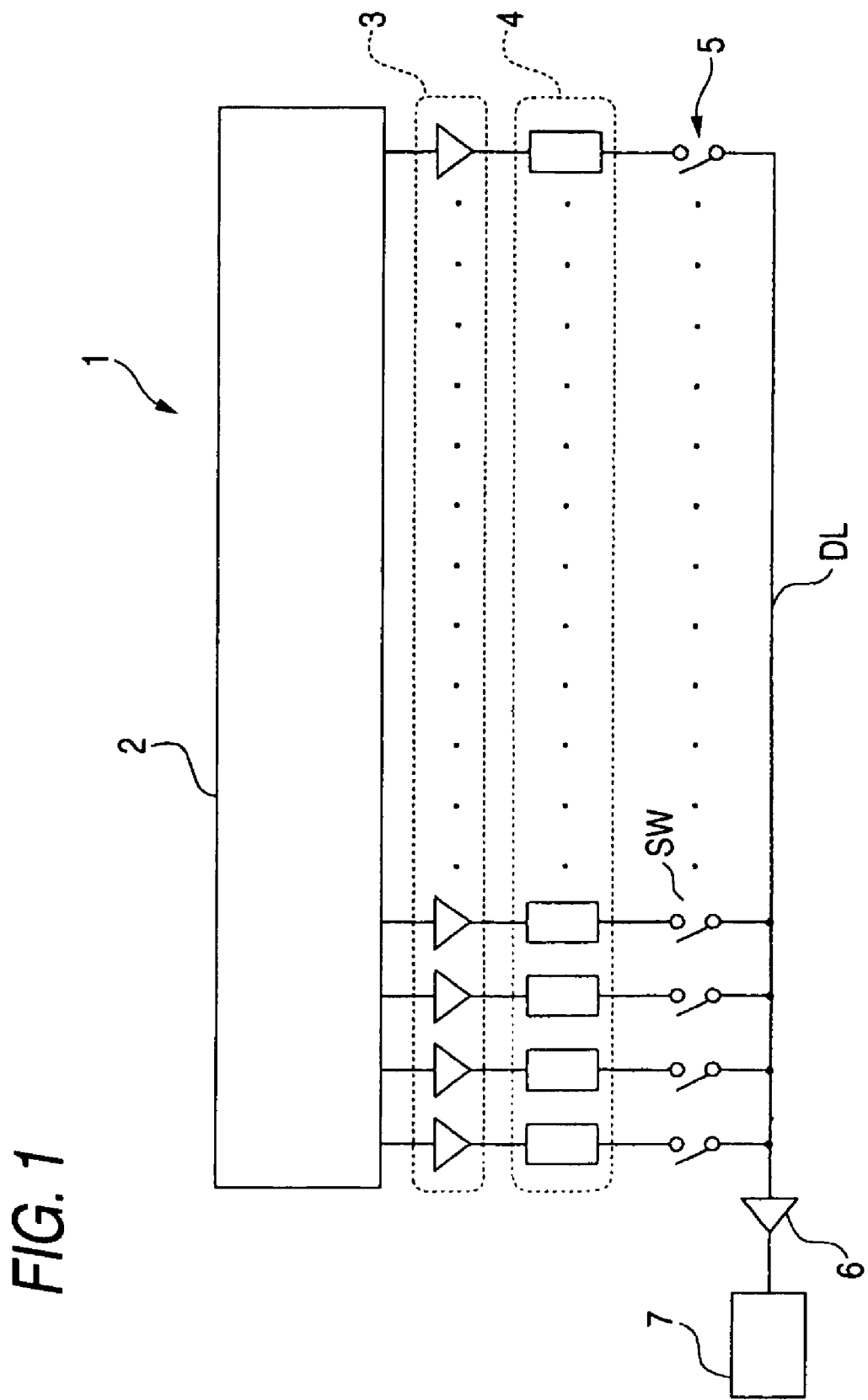
FIG. 1 shows a diagram depicting an exemplary configuration of a circuit system in which data is transferred from a cell array of a typical flash memory (semiconductor device) to an input/output circuit.
Figure 2:
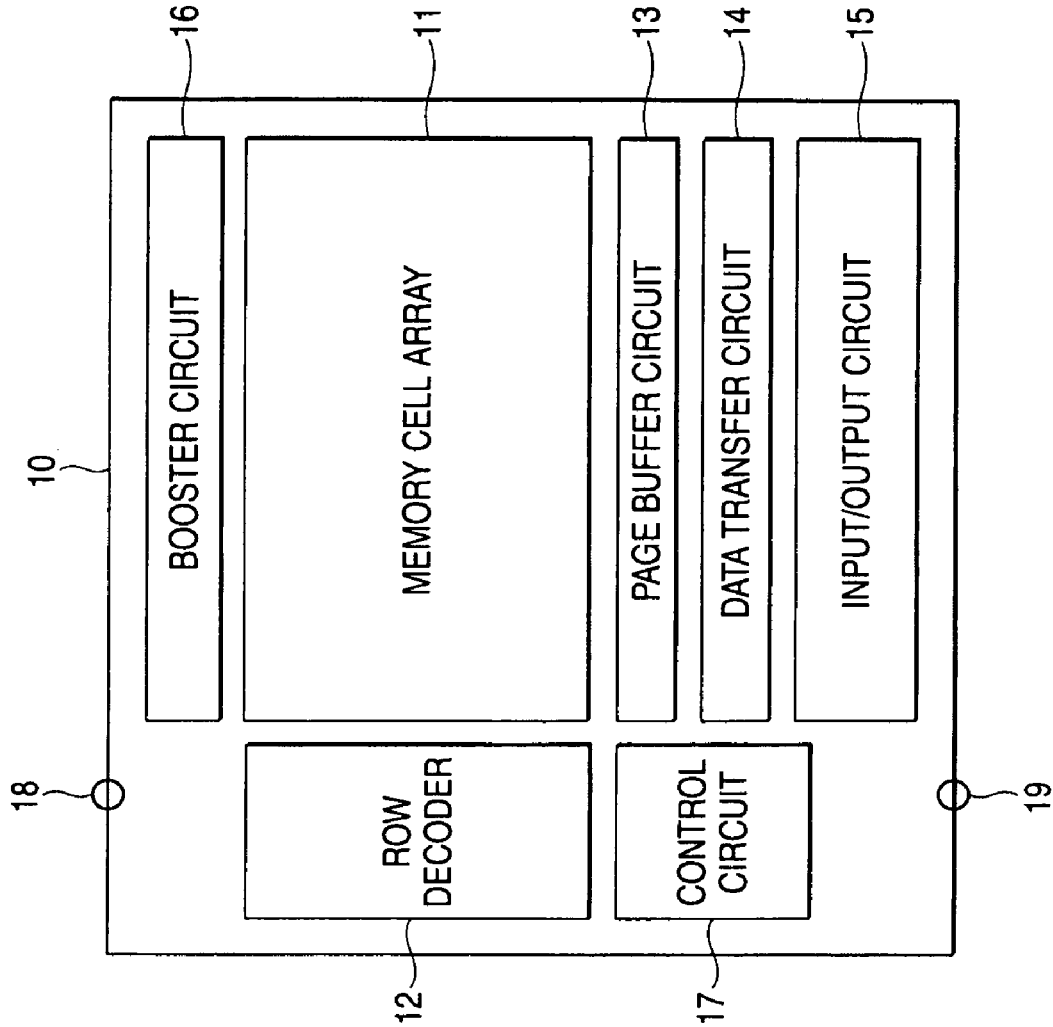
FIG. 2 shows a block diagram depicting a NAND flash memory according to an embodiment of the invention.

FIG. 2 shows a block diagram depicting a NAND flash memory according to an embodiment of the invention.

As shown in FIG. 2, a NAND flash memory 10 has a memory cell array 11, a row decoder 12, a page buffer circuit 13, a data transfer circuit 14, an input/output circuit 15, a booster circuit 16, and a control circuit 17.

In the NAND flash memory 10, the row decoder 12 is disposed on one side of the memory cell array 11, the page buffer circuit 13 and the data transfer circuit 14 are disposed on the other side, and the input/output circuit 15, the booster circuit 16 and the control circuit 17 are disposed which surround them. In addition, the flash memory chip is formed with a single power supply terminal 18 that is an external input, and a ground potential terminal 19 that is an external input.

Figure 3:
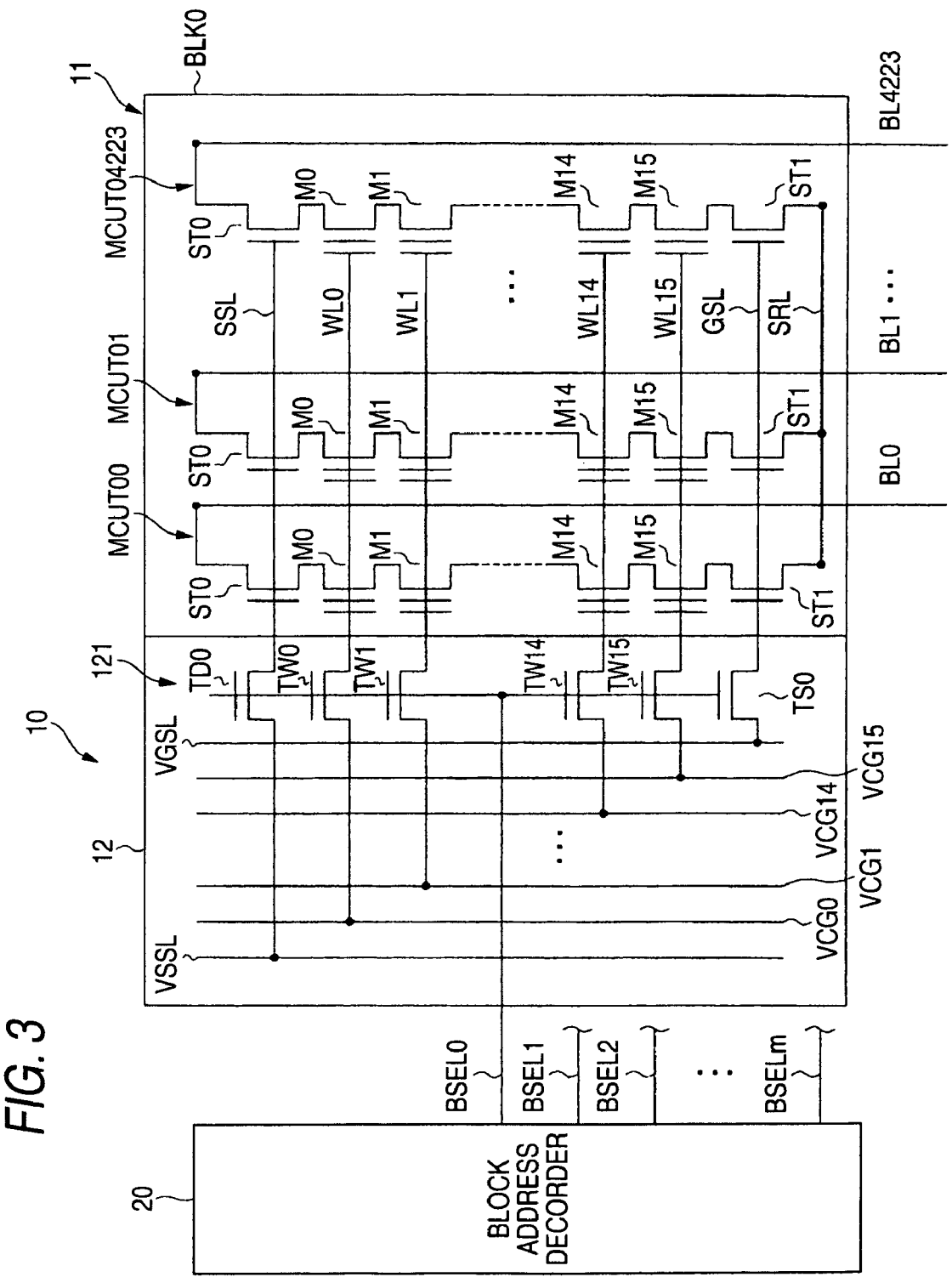
FIG. 3 shows a diagram depicting a memory cell array and a row decoder in a single block of the NAND flash memory according to the embodiment.

FIG. 3 shows a diagram depicting the memory cell array and the row decoder in a single block of the NAND flash memory according to the embodiment.

As shown in FIG. 3, the memory cell array 11 has memory cell units MCUT00, MCUT01, and MCUT04223 in a matrix, each of which is configured of a plurality of memory cell transistors, for example, 16 memory cell transistors M0 to M15 serially connected and two selection gate transistors ST0 and ST1 serially connected to both ends thereof.

In addition, in FIG. 3, for simplicity of the drawing, only one line of block BLK0 is shown in which 4224 of memory cell units MCUT00 to MCUT04223 are arranged in a single row by 4224 columns. Practically, a plurality of blocks BLK1 to BLKm (m blocks) having the same configuration as that of the block BLK0 is further arranged.

In addition, in the example shown in FIG. 3, the number of bit lines is set to 528 bytes that generally 512 bytes are added with 16 bytes for spare, that is, 4224 bit lines.

In addition, the memory cell transistor has the FETMOS structure in which a floating gate and the control gate are layered.

In addition, the memory cell transistor is a memory cell rewritable by tunnel current.

The selection gate transistor ST0 is connected to the drain of the memory cell transistor M0 in the memory cell unit MCUT00 as well as connected to a bit line BL0. The drain of the memory cell transistor M0 in the memory cell unit MCUT01 is connected to a bit line BL1. Similarly, the drain of the memory cell transistor M0 in the memory cell unit MCUT04223 is connected to a bit line BL4223.

In addition, the selection gate transistor ST1 connected to the source of the memory cell transistor M15 in the memory cell units MCUTOO to 04223 is connected to a common source line SRL.

In addition, the gate electrode of the memory cell transistor in the memory cell units MCUT00, MCUT01 to MCUT 04223 arranged in the same row is connected to common word lines WL0 to WL15. The gate electrode of the selection gate transistor ST0 is connected to a common selection gate line SSL. The gate electrode of the selection gate transistor ST1 is connected to a common selection gate line GSL.

The row decoder 12 has a transfer gate group 121 whose conductive state is controlled by the block address decoder 20, and drive voltage supply lines VCG0 to VCG15, VSSL and VGSL for the word lines and the selection gate lines, to which power is supplied from a word line decoder, not shown.

In addition, in FIG. 3, for simplicity of the drawings, the block address decoder portion and the transfer gate group corresponding to the block BLK0 are shown. Practically, the block address decoder portions and the transfer gate groups are disposed as they correspond to a plurality of blocks, not shown.

The row decoder 12 has a function to select the word lines (control gate lines), which supplies the power supply voltage Vcc boosted or not boosted by the booster circuit 16, or the drive voltage equal thereto or below to the drive voltage supply lines VCG0 to VCG15, VSSL, and VGSL, in response to a control signal indicating the operation of read, write (sometimes called a program), or erase in accordance with the operation from an address held in an address register.

The transfer gate group 121 is configured of transfer gates TW0 to TW15, TD0 and TS0.

The transfer gate group 121 is maintained in the conductive state by a signal BSEL which is generated in response to a block address decoded by the block address decoder 20 to drive the selection gate line and the word line for the corresponding block.

More specifically, when the block BLK0 is addressed, each of the transfer gates TW0 to TW15 connects operably the word lines WL0 to WL15 to the drive voltage supply lines VCG0 to VCG15 in response to the output signal BSEL0 from the block address decoder 20, and the transfer gates TD0 and TS0 similarly connect operably the selection gate lines SSL and GSL to the drive voltage supply lines VSSL and VGSL in response to the output signal BSEL0 from the block address decoder 20.

The block address decoder 20 decodes a block address from addresses stored in the address register, not shown, and in response to the decoded block address, it allows the transfer gate group 121 for driving the selection gate line and the word line for the corresponding block in the row decoder 12 to be maintained in the conductive state by a selection signal (block select signal) BSEL.

The page buffer circuit 13 latches read data from the memory cell array 11 or write data to the memory cell array 11 in units of pages.

The data transfer circuit 14 according to the embodiment is configured to sequentially transfer read data in units of pages latched in the page buffer circuit 13 to the input/output circuit 15 and/or to sequentially transfer write data inputted in the input/output circuit 15 to the page buffer circuit 13.

In addition, data transfer done by the data transfer circuit 14 is controlled by the control circuit 17, as described later.

The specific configurations of the read system and the write system of the data transfer circuit 14 will be described later in detail.

Figure 4:
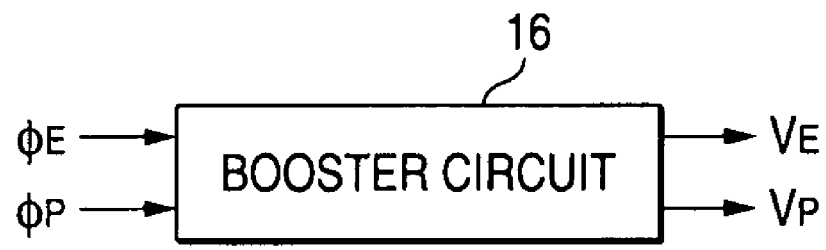
FIG. 4 shows a diagram illustrative of voltage to be boost by a booster circuit according to the embodiment.

As shown in FIG. 4, to the booster circuit 16, an erase signal $\Phi E$ is inputted in erase operation, or a program (write) signal $\Phi P$ is inputted in program (write) operation. Erase voltage VE or program (write) voltage VP higher than power supply voltage Vcc is generated.

The booster circuit 16 according to the embodiment does not have any booster system for read operation. Therefore, in read operation, the drive voltage supply lines VCG0 to VCG15, VSSL, and VGSL for the word line and the selection gate line of the row decoder 12 are supplied with the single power supply voltage Vcc supplied through the single power supply terminal 18 that is the external input, or supplied with voltage lower than the single power supply voltage Vcc and higher than the ground voltage.

In the embodiment, when the stored data of the memory cell transistor M in the memory cell array 11 is defined by two values of logic "1" and logic "0", the threshold voltage of the memory cell transistor having logic "1" stored is set lower than the ground voltage. On the other hand, the threshold voltage of the memory cell transistor M having logic "0" stored is set higher than the ground voltage and equal to or below the single power supply voltage Vcc of the external input.

Figure 5:
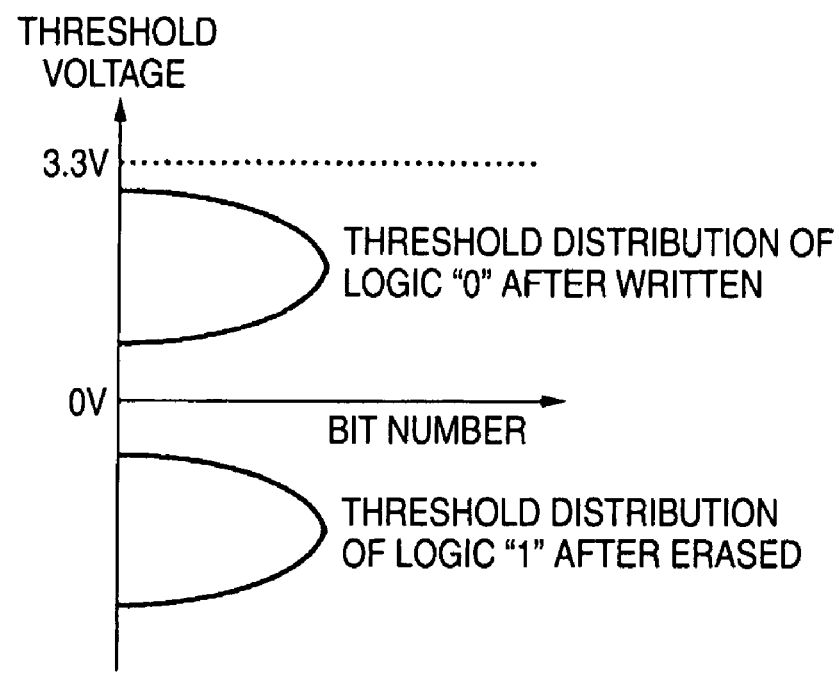
FIG. 5 shows a diagram depicting the threshold distribution of a memory cell transistor to have logic "0" after written and the threshold distribution of a memory cell transistor to have logic "1" after erased.

FIG. 5 shows a diagram depicting the threshold distribution of a memory cell transistor to have logic "0" after written and the threshold distribution of a memory cell transistor to have logic "1" after erased.

In the embodiment, for the stored data of the memory cell transistor M, the threshold voltage Vth of the memory cell transistor having logic "1" stored is set lower than the ground voltage. On the other hand, the threshold voltage Vth of the memory cell transistor having logic "0" stored is set higher than the ground voltage and equal to the single power supply voltage Vcc of the external input, for example, 3.3 V, or below 3.3 V.

Figure 6:
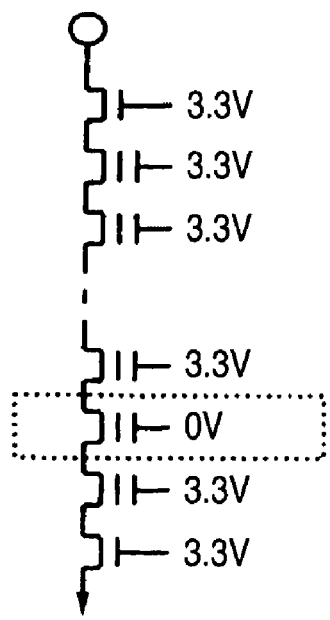
FIG. 6 shows a diagram depicting the applied voltage of a word line in read operation in the embodiment.

FIG. 6 shows a diagram depicting the applied voltage for the word line in read operation in the embodiment.

Except that 0 V is applied to the word line to which the selection memory cell is connected, the 3.3 V of single power supply voltage of external input or below is applied to all of the gates of the selection gate transistors on the bit line side and the source line side and to the unselected word lines in the selected NAND cell unit.

Figure 7:
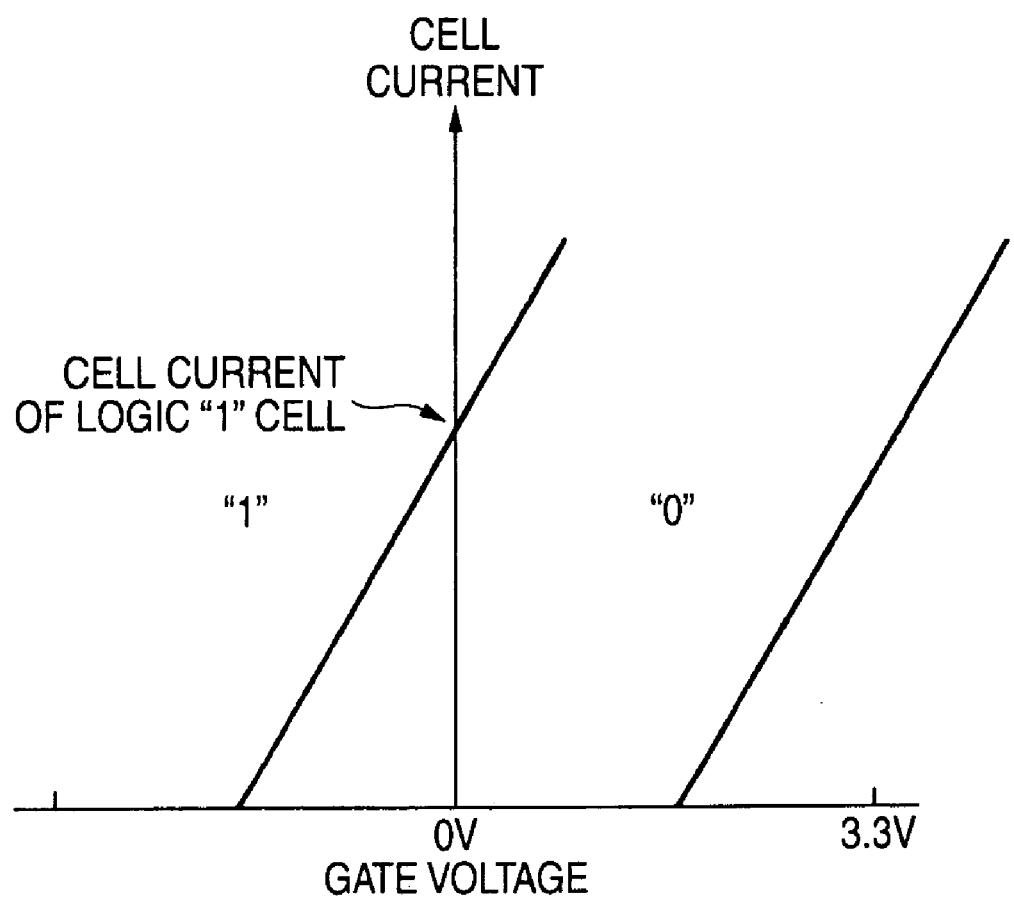
FIG. 7 shows a diagram illustrative of the cell current of the memory cell transistor.

As shown in FIG. 7, the threshold voltage of the selection memory cell transistor Vth decides whether the cell current is carried or not, and then the determination of the stored data to be logic "0" or "1" is made.

It is necessary for the threshold voltage Vth of the memory cell transistor having logic "0" stored to write at the voltage higher than the ground voltage and lower than the single power supply voltage 3.3 V of external input. For the scheme, in the embodiment, it is considered to be the same as the write technique for a multivalued NAND flash memory.

In other words, the step width $\Delta Vpp$ of the write voltage to the word line in writing is set finer, for example, $\Delta Vpp$=about 0.5 V in binary write. In the embodiment, such a scheme may be done to control the write cycle at fine steps that the write voltage is set to $\Delta Vpp$=0.1 V to 0.2 V and data is written for a small amount, and then for verify read.

For the related art of the multivalued NAND flash memory, T. Hara, et al., "A 146 mm$^2$ 8 Gb NAND flash Memory in 70 nm CMOS," in ISSCC'05, SeSSion2.1, February 2005 (Non-Patent Reference 1) and D-S. Byeon, et al., "An 8 Gb Multi-Level NAND flash Memory in a 63 nm CMOS Process," in ISSCC'05, SeSSion2.2, February 2005 (Non-Patent Reference 2) disclose the related art.

Hereinafter, specific exemplary configurations of a read system and a write system of the data transfer circuit according to the embodiment will be described with reference to FIGS. 8 to 30.

Figure 8:
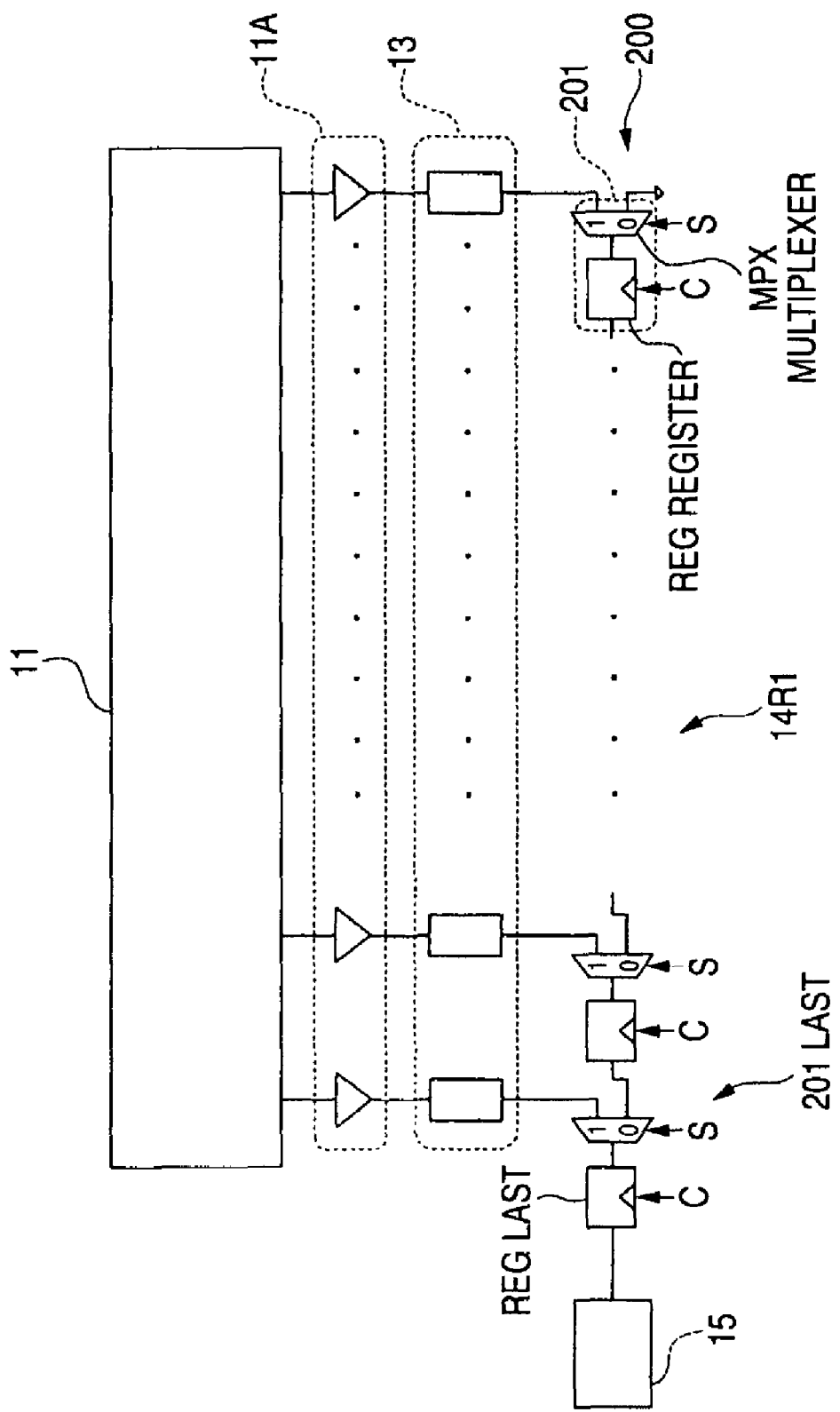
FIG. 8 shows a diagram depicting a first exemplary configuration of a read system of the data transfer circuit according to the embodiment.

FIG. 8 shows a diagram depicting a first exemplary configuration of the read system of the data transfer circuit according to the embodiment.

In addition, in FIG. 8, although the sense amplifier group 11A is shown, it is included in the memory cell array 11 in the block diagram shown in FIG. 2.

A read system data transfer circuit 14R1 shown in FIG. 8 has a plurality of scan registers 201 configured to have a register REG which basically, sequentially transfers data and a multiplexer MPX which fetches data from the page buffer circuit 13 connected to each other, and the scan register operates at every clock.

The data transfer circuit 14R1 has a single layer or a plurality of layers of scan register trains 200 in which a plurality of the scan registers 201 is serially connected. FIG. 8 shows a basic read system, and shows only a single layer of the scan register train 200.

The output of the multiplexer MPX is connected to the input of the register REG, and one input of the multiplexer MPX is connected to the output of a register REG at the next previous stage. The other input of the multiplexer MPX is connected to the data output line of the page buffer circuit 13.

In FIG. 8, when the selection signal S is 1, all the registers fetch read data in the array from the page buffer circuit 13 at the rising edge of the clock C.

Subsequently, when the selection signal S is turned to 0 to enter the clock C, the registers are operated as shift registers to sequentially transfer data taken in each of the registers, and the data is outputted from a register REGlast of a scan register 201last at the last stage (the tail) of the scan register train 200.

In addition, control over the multiplexer MPX by the selection signal S is performed by the control circuit 17.

The example shown in FIG. 8 is the basic configuration of the read system. In the embodiment, in order to reduce current consumption with no impairment of high speed data transfer, it is configured such a way that the scan register trains 200 are divided into layers to drive clocks for the scan registers in the second layer or below slowly enough more than the cycle of data transfer.

Moreover, the multiplexer is arranged at a proper position in the scan register train 200, or the control signal for the scan register train 200 is properly controlled, whereby a certain area can be read or written earlier than another area.

Next, a read system data transfer circuit in which the scan register trains are layered will be described.

Figure 9:
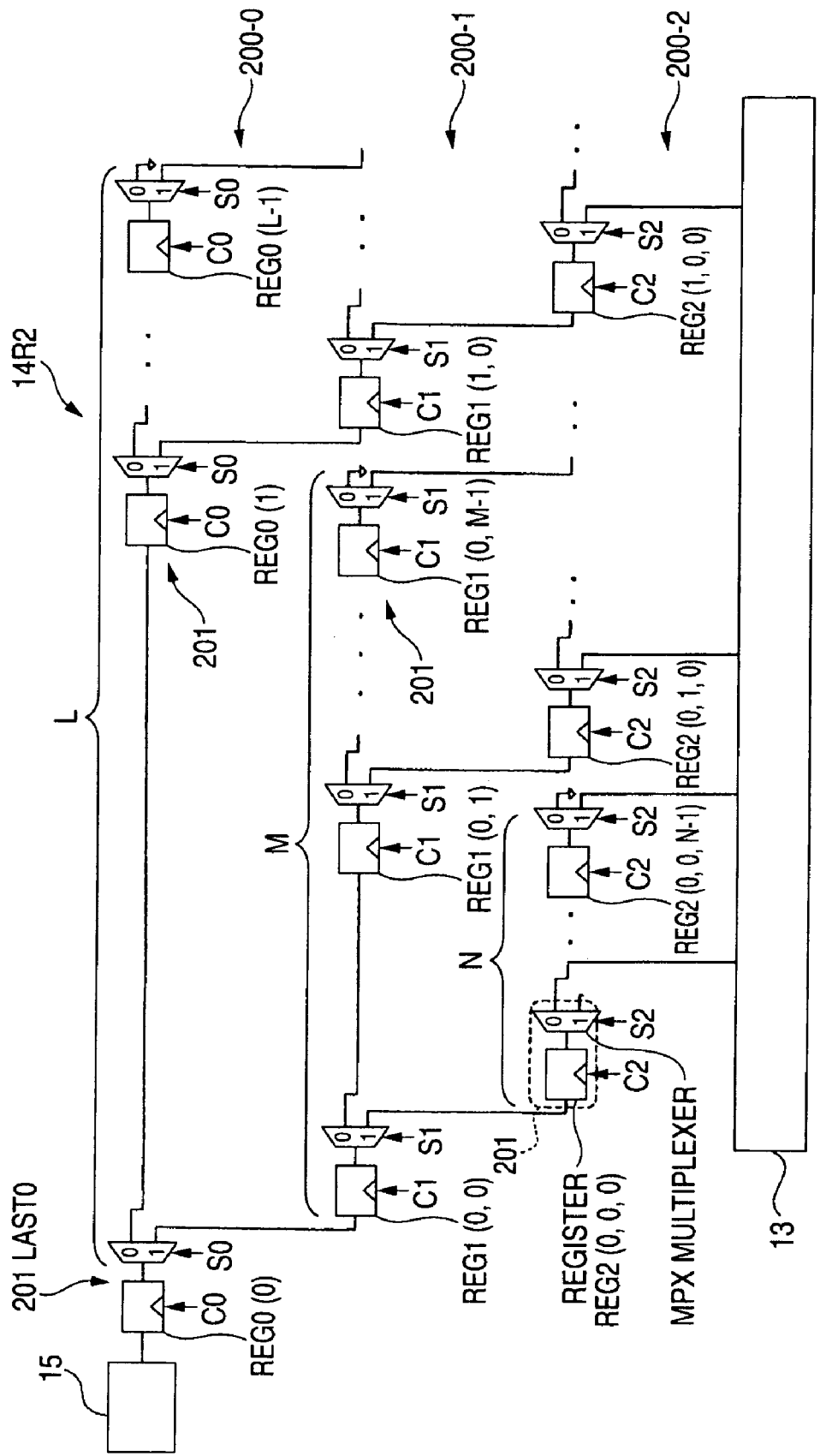
FIG. 9 shows a diagram depicting a second exemplary configuration of the read system of the data transfer circuit according to the embodiment.

FIG. 9 shows a diagram depicting a second exemplary configuration of the read system of the data transfer circuit according to the embodiment.

Figure 10:
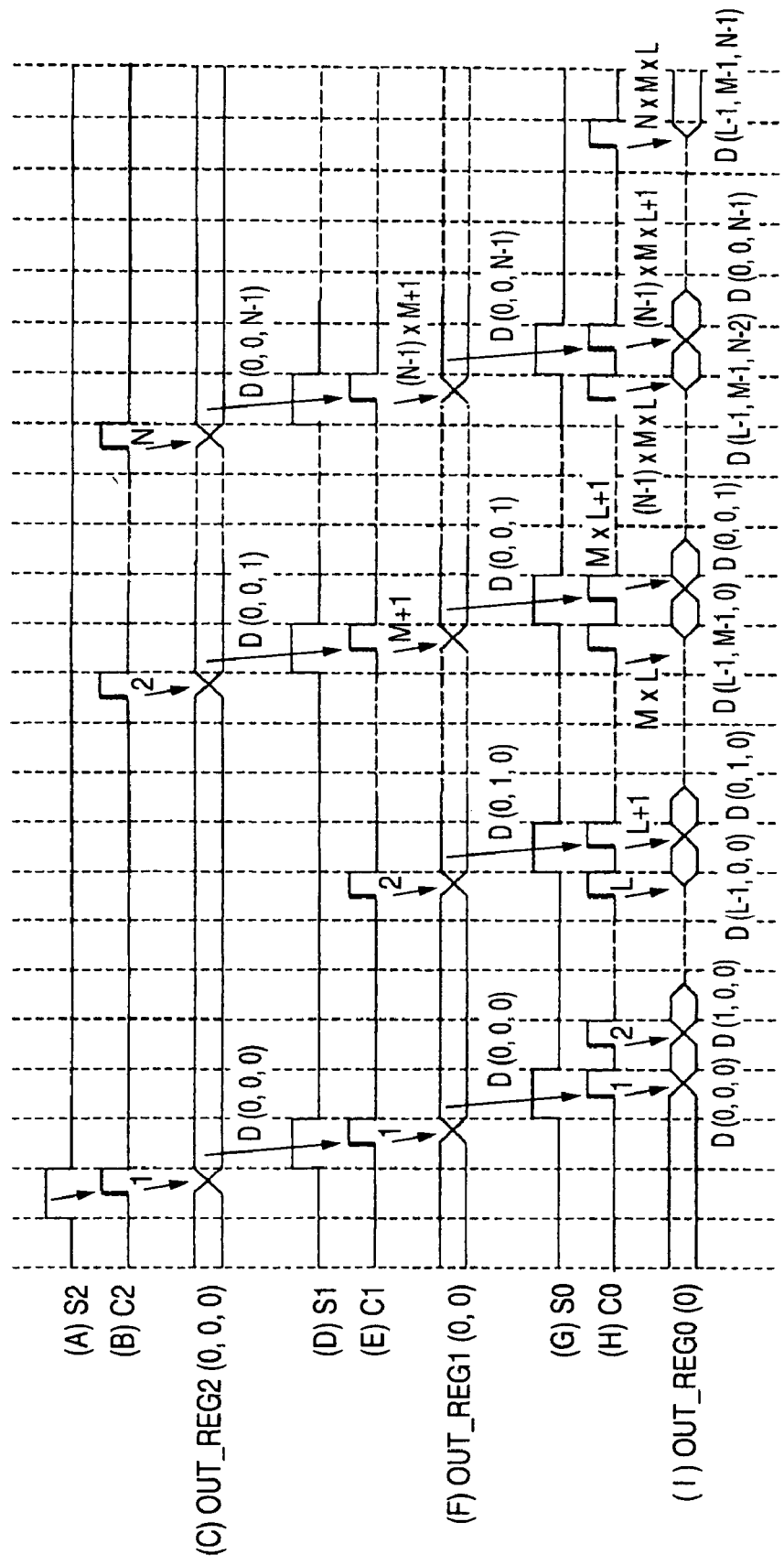
FIG. 10 shows timing charts depicting the circuit shown in FIG. 9.

(A) to (I) in FIG. 10 show timing charts of the circuit shown in FIG. 9.

In addition, in FIG. 9, only the page buffer circuit 13 and a data transfer circuit 14R2 are shown.

In FIG. 9, an example is shown in which the number of layers of the scan register trains is three. It is assumed that the number of the scan registers 201 for each of an uppermost layer 200-0, a second layer 200-1, and a lowermost layer 200-2 is L, M and N, respectively. In this configuration, L*M*N items of data per input/output circuit can be read out of the array.

At this time, it is revealed from FIG. 9 that the total number of the scan registers 201 in the second layer 200-1 is L*M, and that the total number of the scan registers in the lowermost layer 200-2 is L*M*N.

In the multi layer read system data transfer circuit 14R2, the last output of the lower scan register train 201 is connected to one input of the relevant multiplexer MPX of the scan register train one layer above, the other input of the multiplexer MPX of the scan register train 200-2 in the lowermost layer is connected to the data output line of the page buffer circuit 13, and the output of the scan register train 200-0 in the uppermost layer, that is, the output of the register REG0 (0) of the scan register 201last0 at the last stage is connected to the input of the input/output circuit 15.

In addition, by the control circuit 17, a selection signal S0 is supplied to the multiplexer MPX of the scan register train 200-0 in the uppermost layer, and the clock C0 is supplied to the register REG0. A selection signal S1 is supplied to the multiplexer MPX of the scan register train 200-1 in the second layer, a clock C1 is supplied to the register REG1, a selection signal S2 is supplied to the multiplexer MPX of the scan register train 200-2 in the lowermost layer, and a clock C2 is supplied to the register REG2.

The operation of the circuit shown in FIG. 9 will be described.

As shown in (A) to (I) in FIG. 10, 1 is first given to the selection signal S2, and then the rising edge of the clock C2 is given once, whereby all the items of data from the array can be fetched from the page buffer circuit 13 into the scan register REG2 (*,*,*) Subsequently, 1 is given to the selection signal S1, and then the rising edge of the clock C1 is given once, whereby data in the register REG2 (*, *, 0) of the scan register train 200-2 can be fetched into the register REG1 (*, *) of the scan register train 200-1 in the second layer.

Subsequently, 1 is given to the selection signal S0, and the rising edge of the clock C0 is given once, whereby data in the register REG1 (*, 0) of the scan register train 200-1 can be fetched into the register REG0 (*) of the scan register train 200-0 in the uppermost layer.

At the subsequent rising edge of the clock C0 and after that, 0 is given to the selection signal S0 to operate as a shift register, and data in the scan registers in the uppermost layer is taken out of the output.

Since the number of the scan registers in the uppermost layer is L, data fetched from the scan register train 200-1 in the second layer is all taken out when the clock C0 is toggled once at the time when 1 is inputted to the selection signal S0, whereas when it is toggled for L−1 times at the time when 0 is inputted to the selection signal S0.

At the subsequent rising edge of the clock C0, 1 is given to the selection signal S0 to fetch the next data from the scan registers in the second layer.

However, before this is done, it is necessary to toggle the clock C1 once to advance data in the state in which 0 is given to the selection signal S1.

Similarly, when the clock C0 is toggled for L*M times, data fetched in the scan registers in the second layer is all taken out as well.

In the next step, it is necessary to fetch data from the scan registers 201 of the scan register train 200-2 in the lowermost layer, but prior to this, it is necessary to advance data by toggling he clock C2 once in the state in which 0 is given to the selection signal S2.

These operations are repeated to toggle the clock C0 for L*M*N times to sequentially fetch all the items of data from the array.

It is assumed that the electric power is p that is consumed when the clock for a single scan register is toggled once. In circuit shown in FIG. 8, it is necessary for L*M*N of scan registers to toggle the clock for L*M*N times in order to fetch all the items of data, and thus p*(L*M*N)*(L*M*N) of electric power is to be consumed.

On the other hand, in the circuit shown in FIG. 9, the electric power to be consumed in the uppermost layer is p*L*(L*M*N). The electric power to be consumed in the second layer is p*(L*M)*(M*N) because it is necessary for L*M of scan registers to toggle the clock for M*N times. The electric power to be consumed in the third layer is p*(L*M*N)*N because it is necessary for L*M*N of scan registers to toggle the clock for N times. The total is p{L*(L*M*N)+(L*M)*(M*N)+(L*M*N)*N}. When it is computed where L=M=N=16, the current consumption is p*1.68E7 in the example shown in FIG. 8, whereas it is p*1.97E5 in the example shown in FIG. 9, allowing a significant reduction in current consumption by about 1.2% of the example shown in FIG. 8.

As described above, in the circuit shown in FIG. 9, it is unnecessary to toggle the clock C1 for the scan registers in the second layer 201 until all the items of data on the scan registers in the uppermost layer are fetched into the input/output circuit 15. Therefore, it is sufficient that the clock C1 for the scan registers in the second layer is driven by the cycle as L times as much as the cycle of the clock C0 for the scan registers in the uppermost layer.

Similarly, it is sufficient that the clock for the scan registers in the lowermost layer is driven by the cycle as L*M times as much as the cycle of the clock for the uppermost layer. In this manner, the clock is driven by a slow cycle, whereby current consumption can be reduced with no impairment of high speed data transfer. For example, when it is computed where L=M=N=16, current consumption caused by toggling the registers can be reduced to about 1.2% before the layered structure is made.

The circuit shown in FIG. 9 can be used for high speed data transfer from the memory cell array 11 to the input/output circuit 15 in the chip like this. In addition, it can be used as well for semiconductor devices having the same array structure such as an image sensor and an image panel.

In addition, the buffer memory (page buffer circuit) 13 is provided between the memory cell array 11 and the scan register train 200-2 in the lowermost layer, whereby after data is fetched into the scan register 200-2, data can be read out of the memory cell array 11 to the buffer memory (page buffer circuit) 13 while data is being transferred in the data transfer circuit 14.

Figure 11:
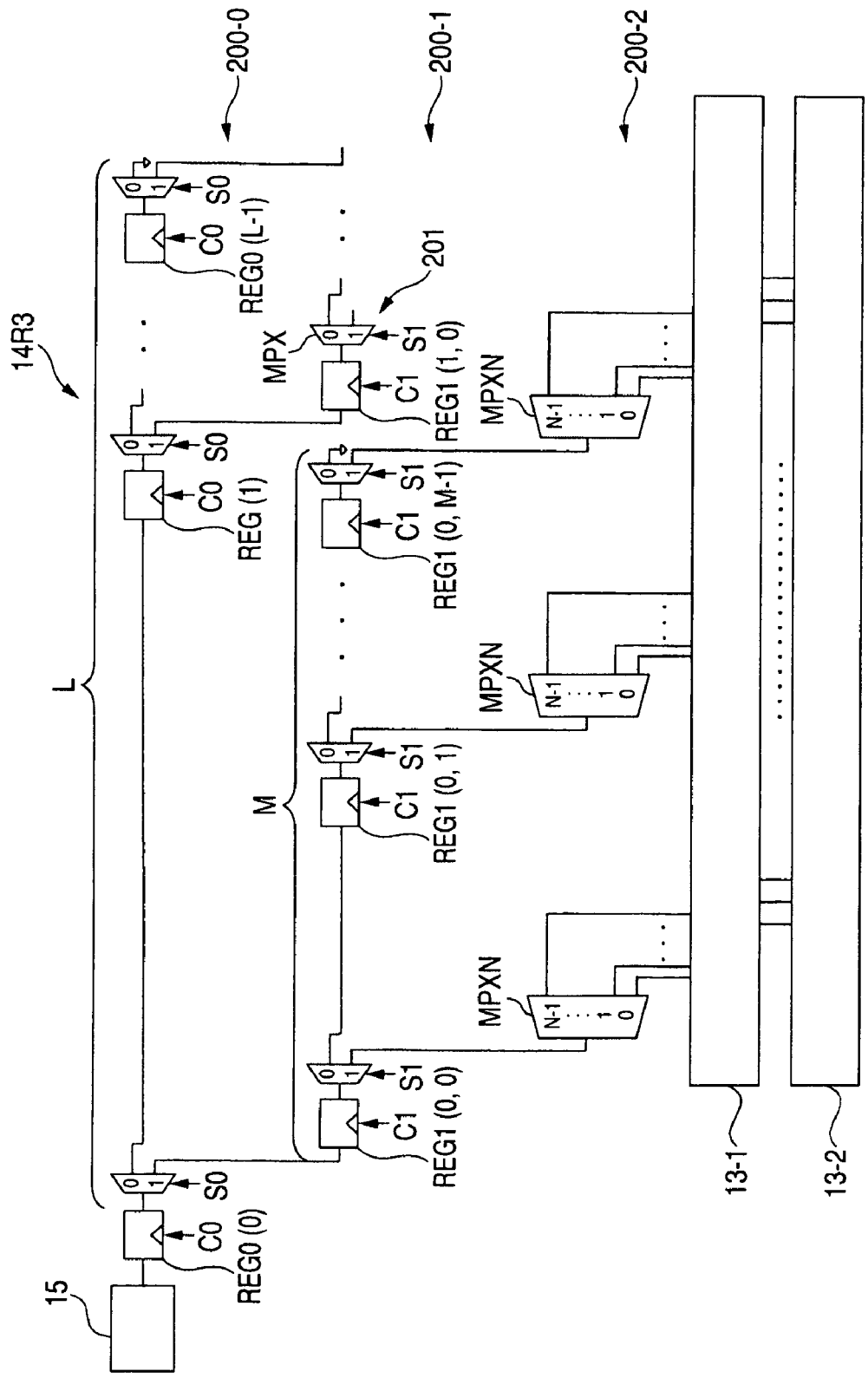
FIG. 11 shows a diagram depicting a third exemplary configuration of the read system of the data transfer circuit according to the embodiment.

FIG. 11 shows a diagram depicting a third exemplary configuration of the read system of the data transfer circuit according to the embodiment.

Figure 12:
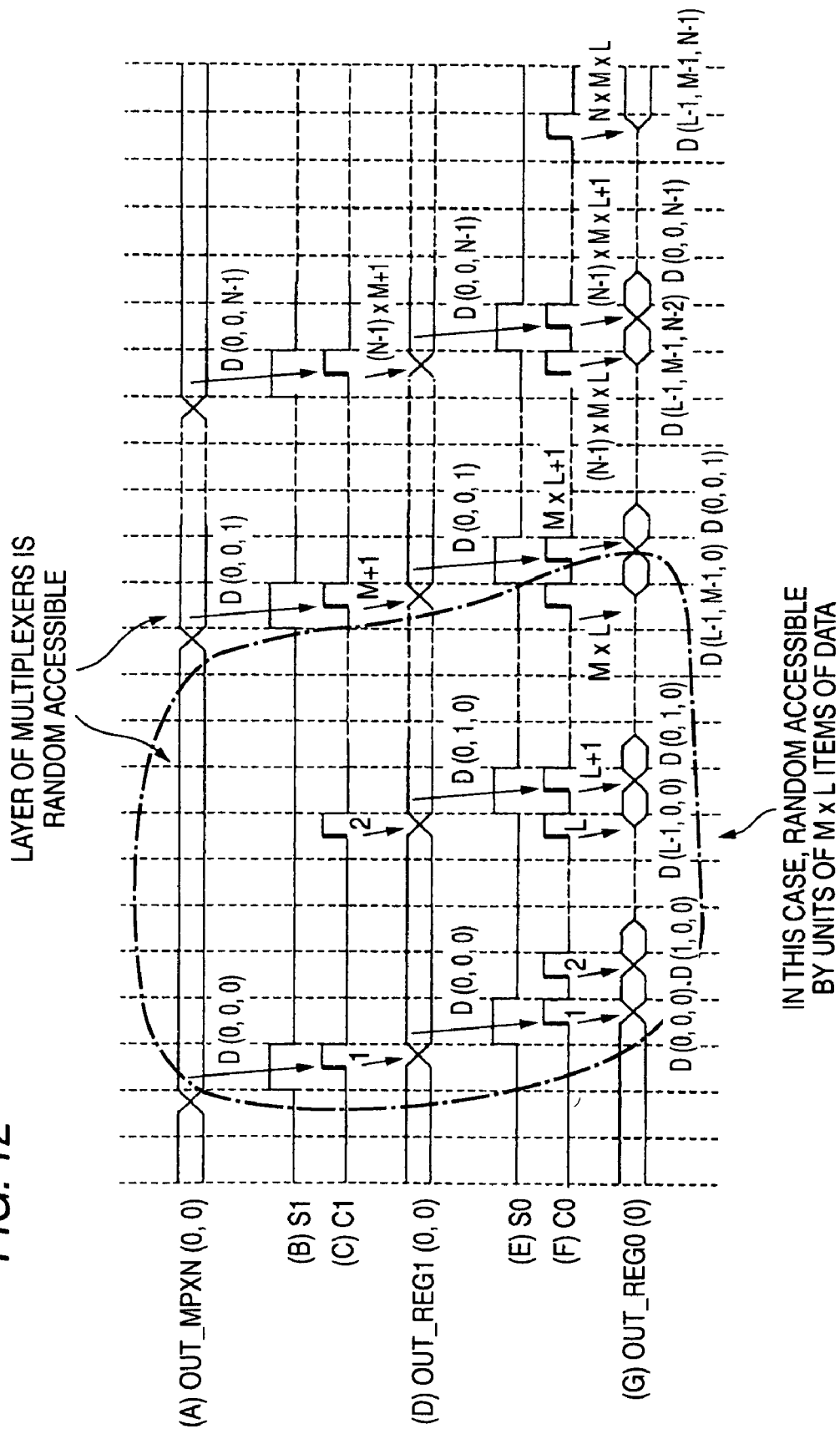
FIG. 12 shows timing charts depicting the circuit shown in FIG. 11.

(A) to (G) in FIG. 12 show timing charts of the circuit shown in FIG. 11.

The difference of the circuit shown in FIG. 11 from the circuit shown in FIG. 9 is in that multiplexers having multiple inputs are arranged instead of the scan registers in the lowermost layer train and that two buffer memories (page buffer circuits) are arranged between the cell array and the multiplexers of the data transfer circuit.

In the case in which the multiplexers are arranged instead of the scan registers in the lowermost layer train of the data transfer circuit 14, it is necessary to hold data in the buffer memories during data transfer. Therefore, in order to read data out of the cell array to the buffer memories during data transfer, as shown in FIG. 11, it is necessary to provide at least two buffer memories (page buffer circuits) between the cell array and the multiplexers of the data transfer circuit.

In the actual circuit, since the number of the scan registers of the scan register train 200-2 in the lowermost layer is the greatest and the layout area becomes greater, the scan register train can be replaced by multiplexers MPXN having N inputs.

In this case, before the scan registers in the second layer demand new data, the multiplexers MPXN having N inputs are used to supply subsequent data to the input of multiplexers MPX of the scan register 201 of the scan register train 200-1 in the second layer.

In addition, in the case in which the scan register train is used for all the layers, for reading data, it is necessary to do clock operation for the number of times equivalent to the number of the scan registers between the memory cell array 11 and the input/output circuit 15. However, in the case in which the multiplexer MPX is used, data read can be performed for the layer using the multiplexer MPX by the minimum number of clock operations depending on load and cycle time. This means that when random access is made, the multiplexer is used to reduce the number of clock operations necessary for reading data.

Moreover, since the layer using the multiplexer can have random access, random access can be made for every unit of data of a product of the number of scan registers in each layer even when the scan register train is used in other layers for sequential data read.

On the other hand, the scan registers are used in the uppermost layer, whereby the load capacity of the data line can be more reduced than the case of using the multiplexer, and data transfer in the uppermost layer including the input/output circuit can be performed at high speed.

Figure 13:
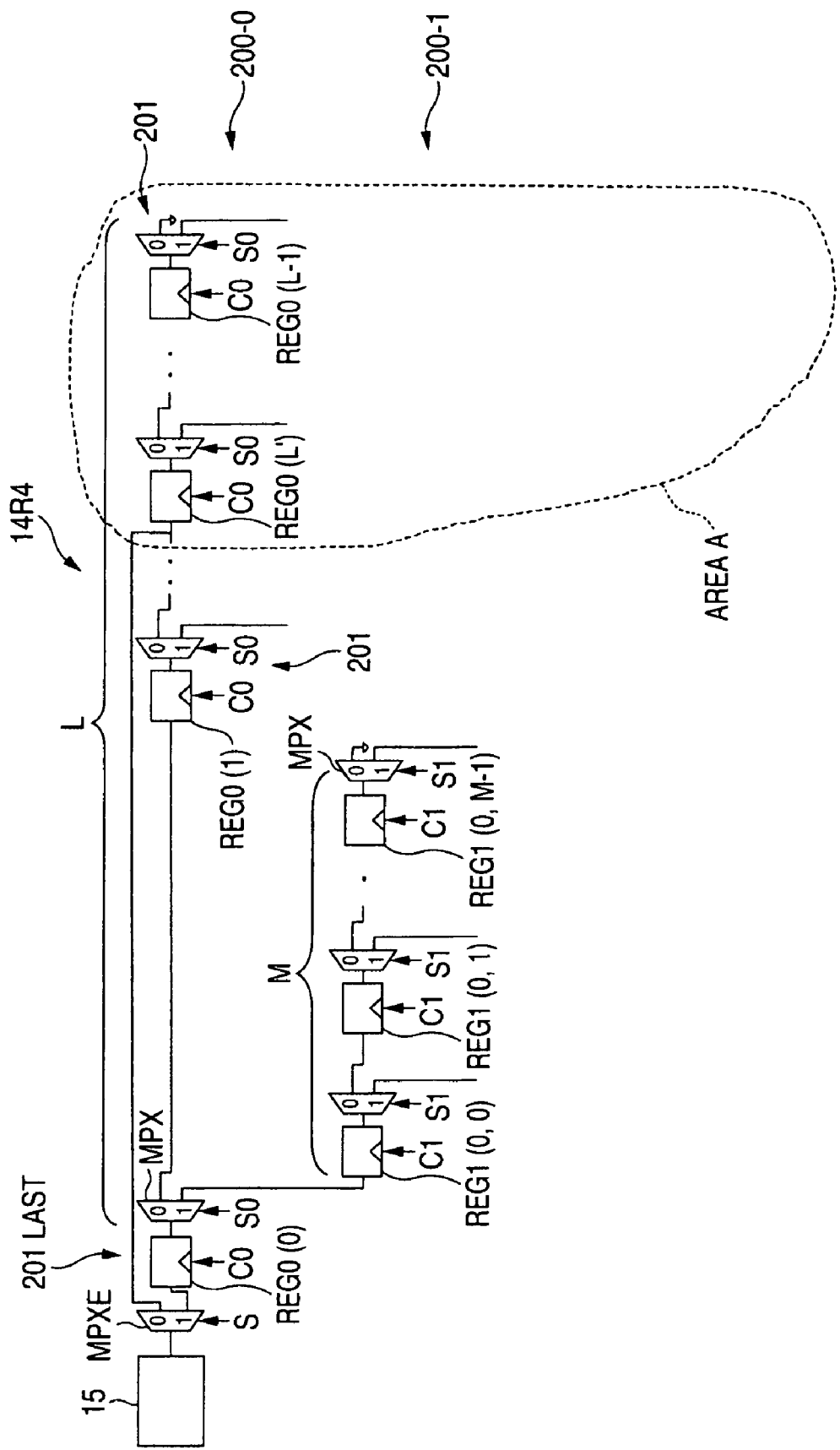
FIG. 13 shows a diagram depicting a fourth exemplary configuration of the read system of the data transfer circuit according to the embodiment.

FIG. 13 shows a diagram depicting a fourth exemplary configuration of the read system of the data transfer circuit according to the embodiment.

Figure 14:
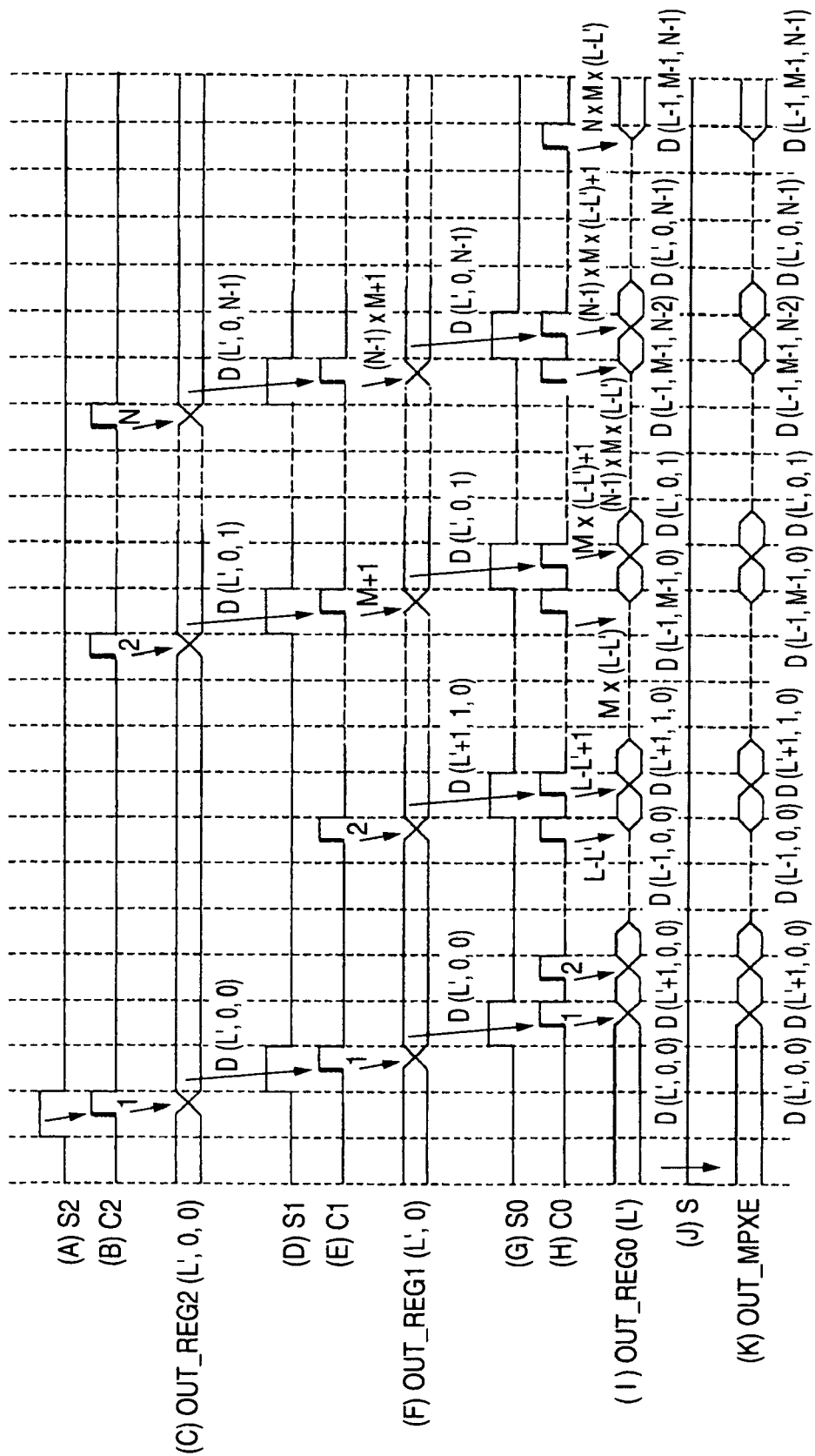
FIG. 14 shows timing charts depicting the circuit shown in FIG. 13.

(A) to (K) in FIG. 14 show timing charts of the circuit shown in FIG. 13.

The difference of the circuit shown in FIG. 13 from the circuit shown in FIG. 9 (or FIG. 11) is that a multiplexer MPXE is arranged at the output part of the scan register 201 at the last stage (the tail) of the scan register train 200, one input of the multiplexer MPXE is connected to the output of the scan register 201 last at the last stage of the original scan register train, and the other input is connected to the output of the scan register at the forward stage more than the scan register 201 last at the last stage in the scan register train 200.

In this case, this circuit can be used when it is desired to read data in a certain data area out of in data the array earlier. The multiplexer MPXE is inserted right before the input/output circuit 15. In the typical read operation, 0 is given to the selection signal S to read data in the order described above.

When data on a data area A is desired to read earlier, 1 is given to the selection signal S to implement this.

According to the circuit shown in FIG. 13, there is an advantage that data can be read in earlier order as necessary even in an area which includes the scan registers arranged in the forward side of the scan register train 200-0 closer to the first stage to be the input part, not on the last stage side to be the output part of the scan register train 200-0, and in which it takes time to read data by sequential data read.

Figure 15:
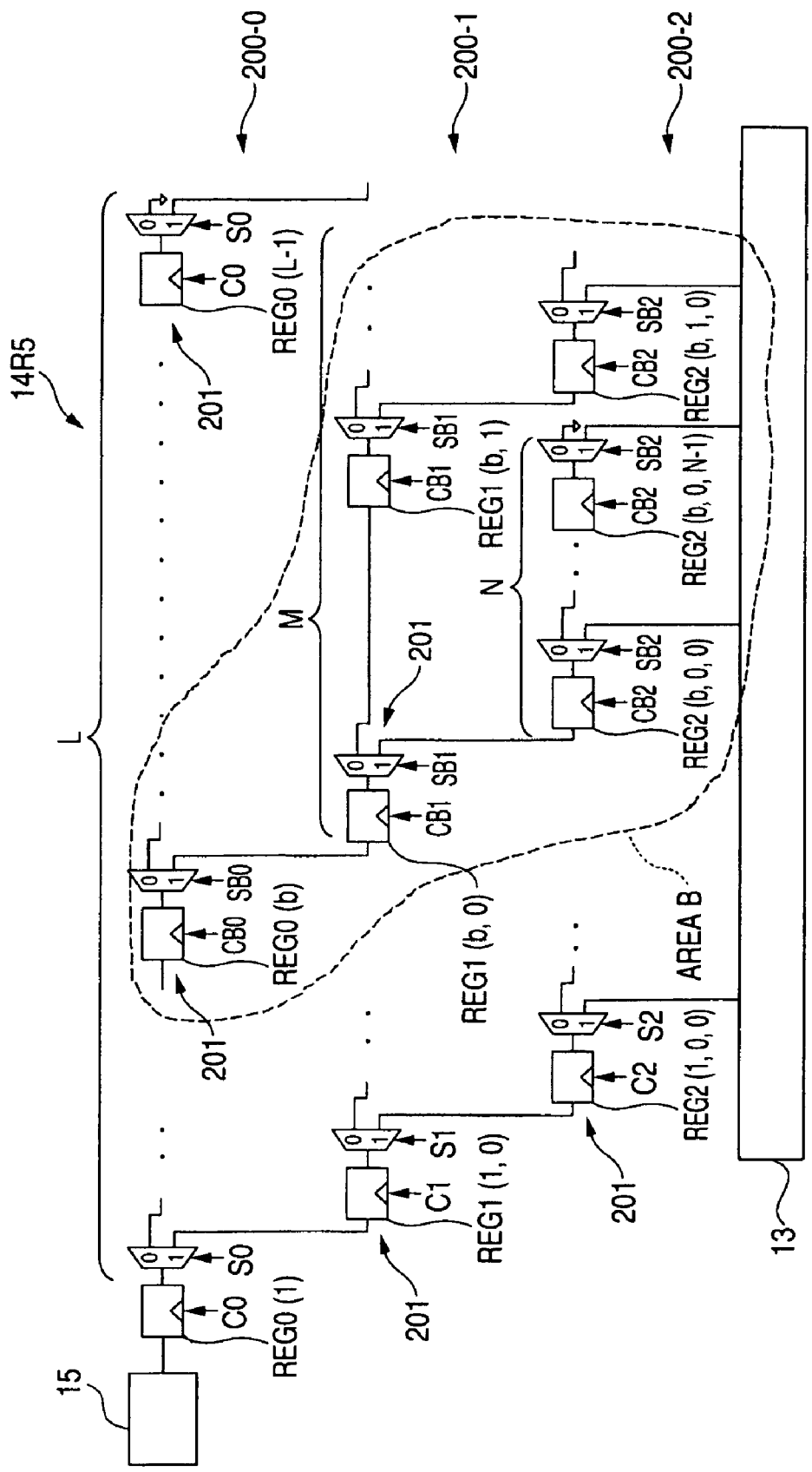
FIG. 15 shows a diagram depicting a fifth exemplary configuration of the read system of the data transfer circuit according to the embodiment.

FIG. 15 shows a diagram depicting a fifth exemplary configuration of the read system of the data transfer circuit according to the embodiment.

Figure 16:
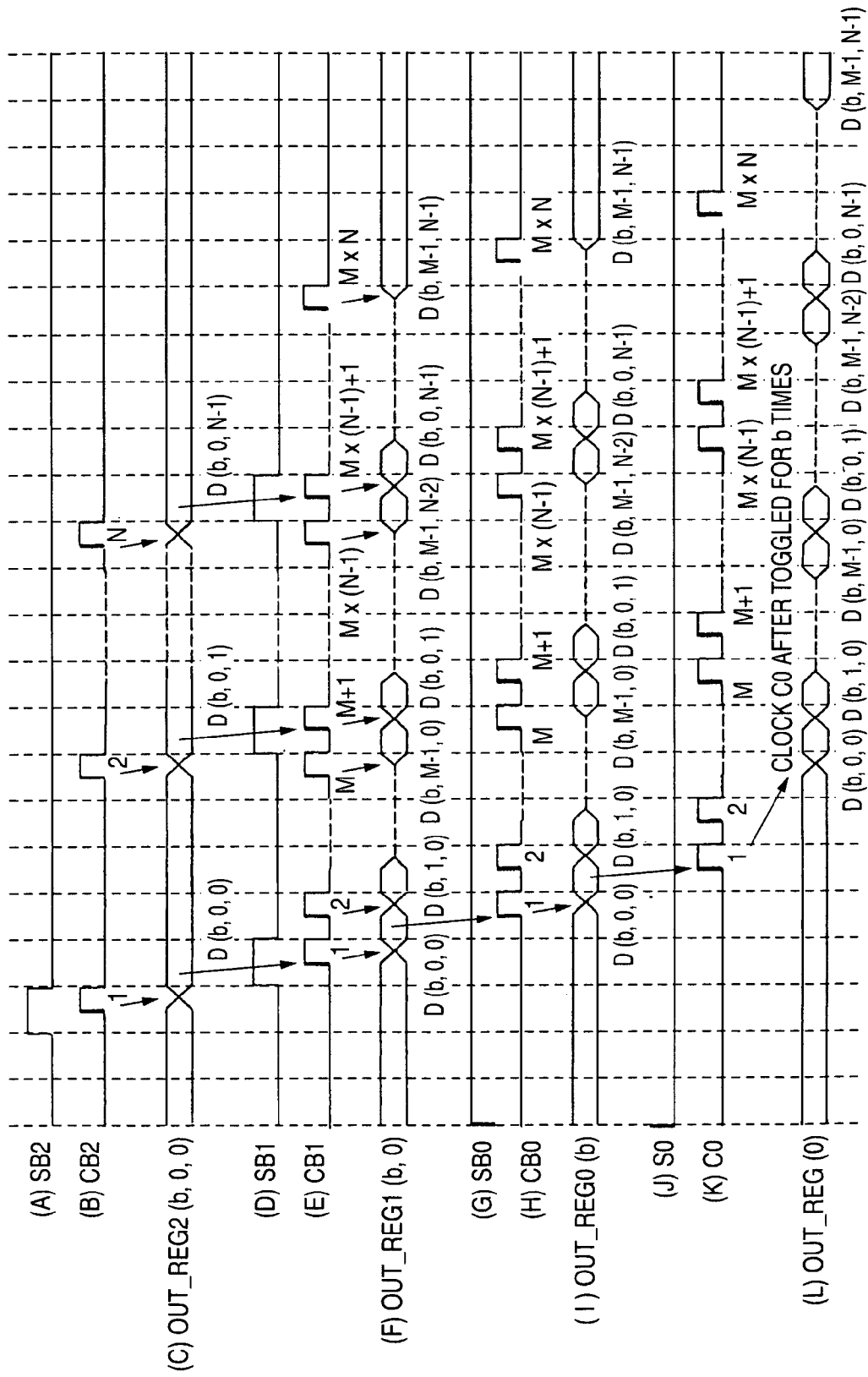
FIG. 16 shows timing charts depicting the circuit shown in FIG. 15.

(A) to (I) in FIG. 16 show timing charts of the circuit shown in FIG. 15.

The circuit configuration shown in FIG. 15 is the same as that in FIG. 9, but the control method is different.

In FIG. 15, when it is desired to read data in an area B earlier, 1 is continuously given to a selection signal SB0 in the scan register 201 including a register REG0 (b) of the scan register train 200-0 in the uppermost layer. 0 is continuously given to the selection signal S0 in the scan registers 201 other than this register as in a typical manner.

When the clock C0 is continuously toggled in this state, the scan register 201 tries to fetch data in the second layer one after another. Thus, it is necessary only for the area B that a clock CB1 is toggled in synchronization with the clock C0 in the second layer.

When 0 is given to a selection signal SB1 in the second layer in the area B to toggle the clocks C0 and CB1 for M times, data in the scan registers in the second layer in the area B is all taken out. Therefore, before this is done, it is necessary that 0 is given to a selection signal SB2 of the scan registers 201 of the scan register train 200-2 in the lowermost layer to toggle a clock CB2 once. When the clocks C0 and CB1 are toggled for M*N times, data in the area B is all taken out.

Practically, since data goes on the scan registers of the scan register train 200-0 in the uppermost layer in turn and data is taken out of the input/output circuit 15, it is necessary to toggle the clock C0 by the extra number to reach there. However, data in the area B can be taken out early enough in comparison to reading data in turn from the beginning.

In addition, here, the case is described in which a single scan register in the uppermost layer is considered as the area B. However, this can be implemented similarly even when the area of a plurality of the scan registers in the uppermost layer is considered as the area for early read.

The control method like this is adopted to freely change the order to read data when it is desired to read data in the scan register train in a certain lower layer earlier.

Figure 17:
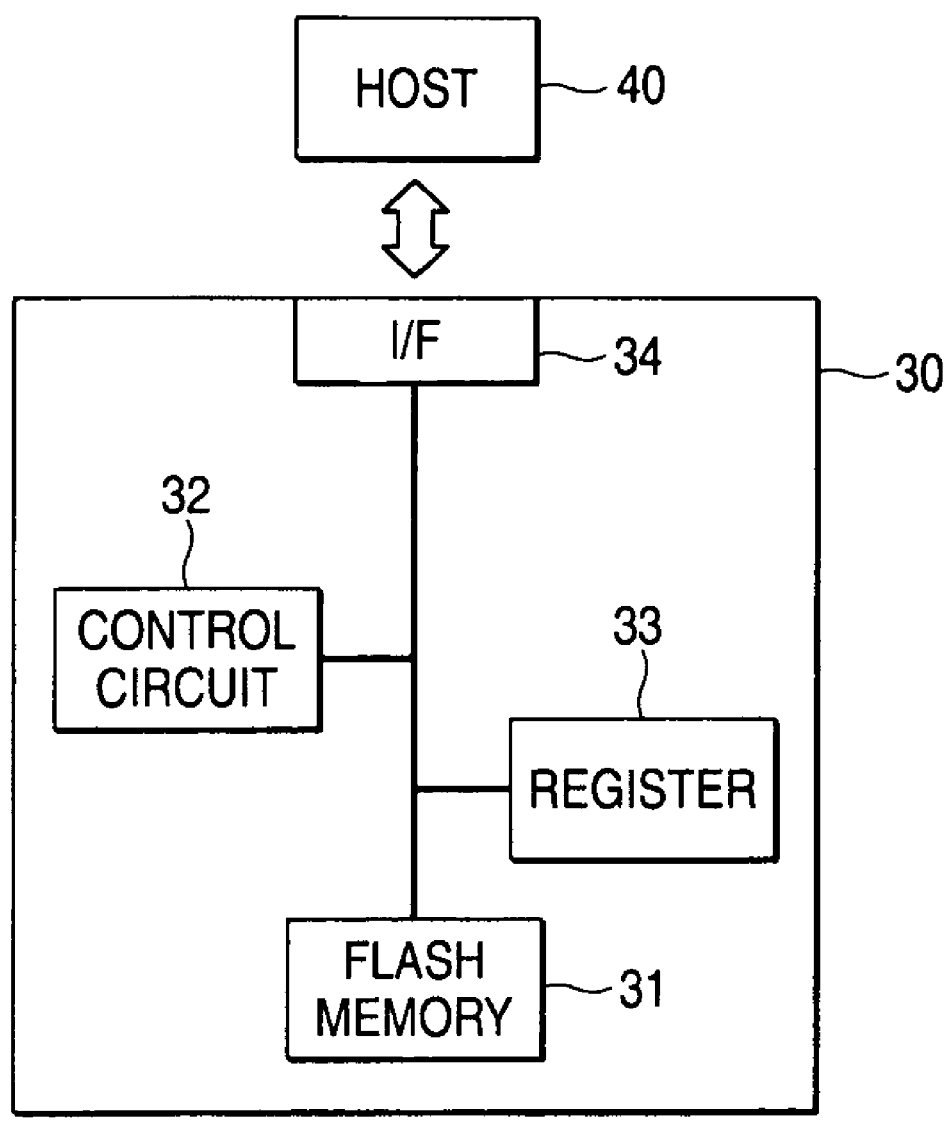
FIG. 17 shows a diagram depicting an exemplary configuration of a data storage apparatus according to an embodiment of the invention.

FIG. 17 shows a diagram depicting an exemplary configuration of a data storage apparatus according to an embodiment of the invention.

A data storage apparatus 30 shown in FIG. 17 has a main storage medium 31 including a flash memory that is a semiconductor device having the data transfer circuit 14R of the read system described above, a control circuit 32, a register 33, and a host interface 34 incorporated therein. In addition, in FIG. 17, 40 denotes a host apparatus.

In the data storage apparatus 30 shown in FIG. 17, the control circuit 32 adds management data to user data inputted from the host apparatus 40 to create storage data on the register 33, and stores it in the flash memory 31.

Figure 18:
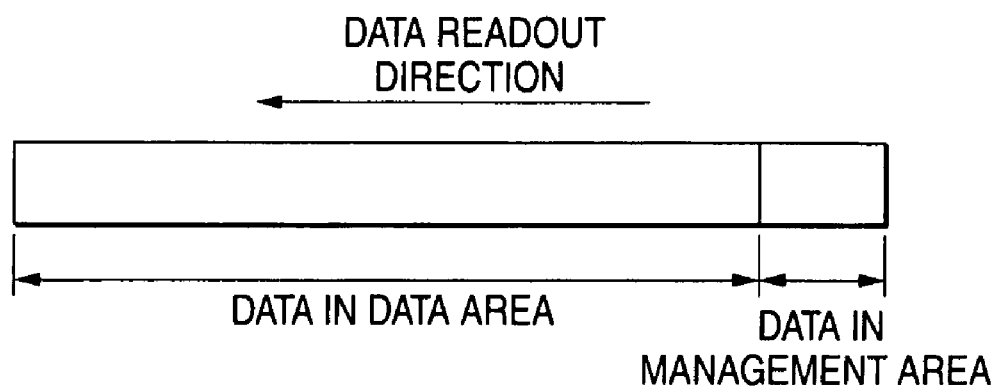
FIG. 18 shows a diagram depicting a write form of data and management data in a typical flash memory.

Generally, in the flash memory, since the user data is written in the higher level address of management data as shown in FIG. 18, it is difficult to read only management data earlier when data is read sequentially.

Figure 19:
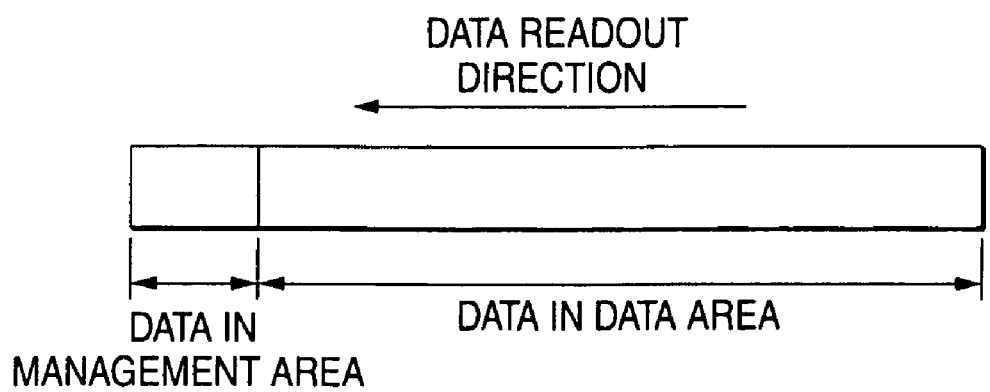
FIG. 19 shows a diagram depicting a write form of data and management data in the flash memory according to the embodiment.

On the other hand, in the embodiment, as shown in FIG. 19, management data is written in the lower level address. With this scheme, management data can be read from the beginning even when data is read only in a sequential manner.

Figure 20:
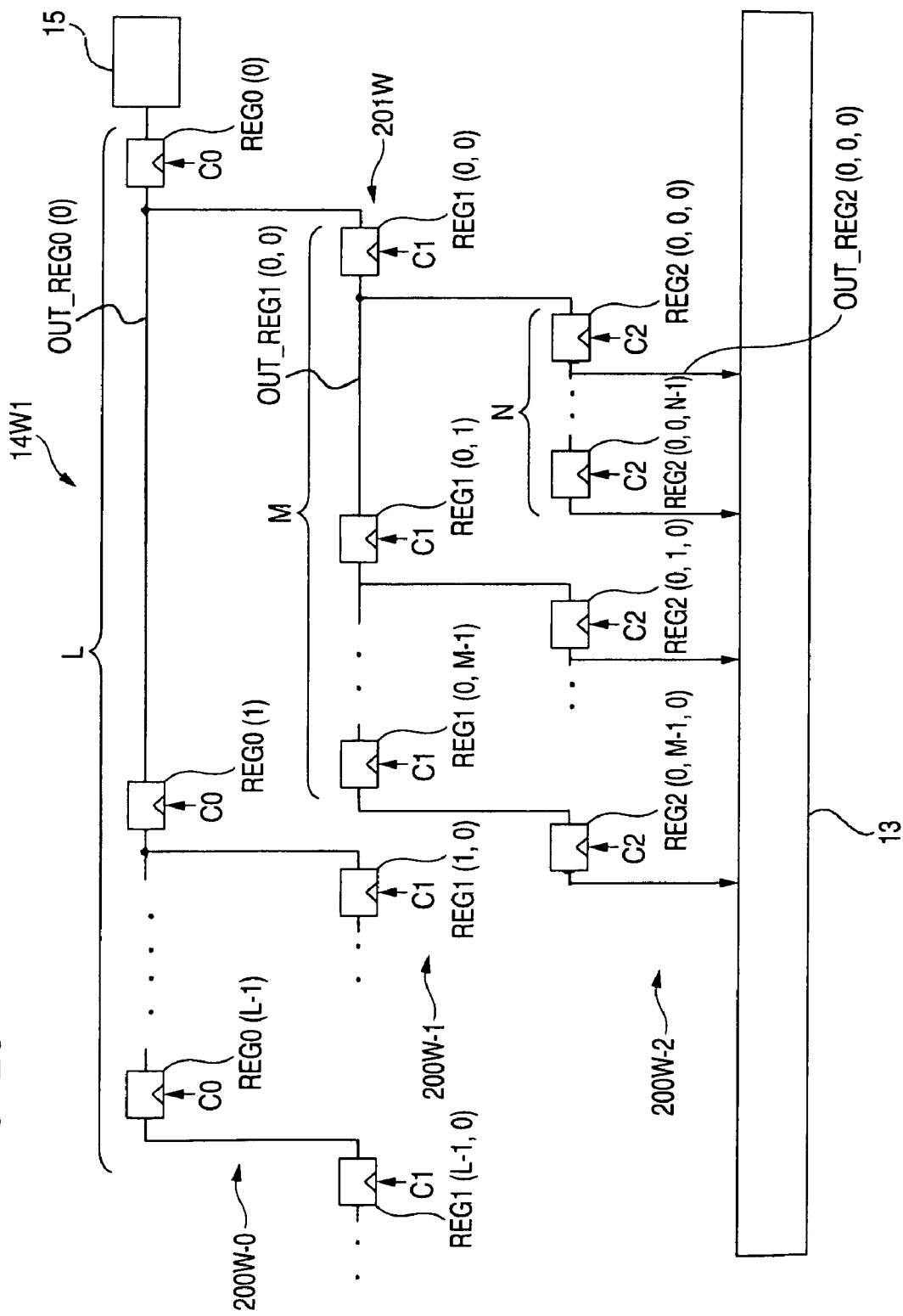
FIG. 20 shows a diagram depicting a first exemplary configuration of a write system of the data transfer circuit according to the embodiment.

FIG. 20 shows a diagram depicting a first exemplary configuration of a write system of the data transfer circuit according to the embodiment.

Figure 21:
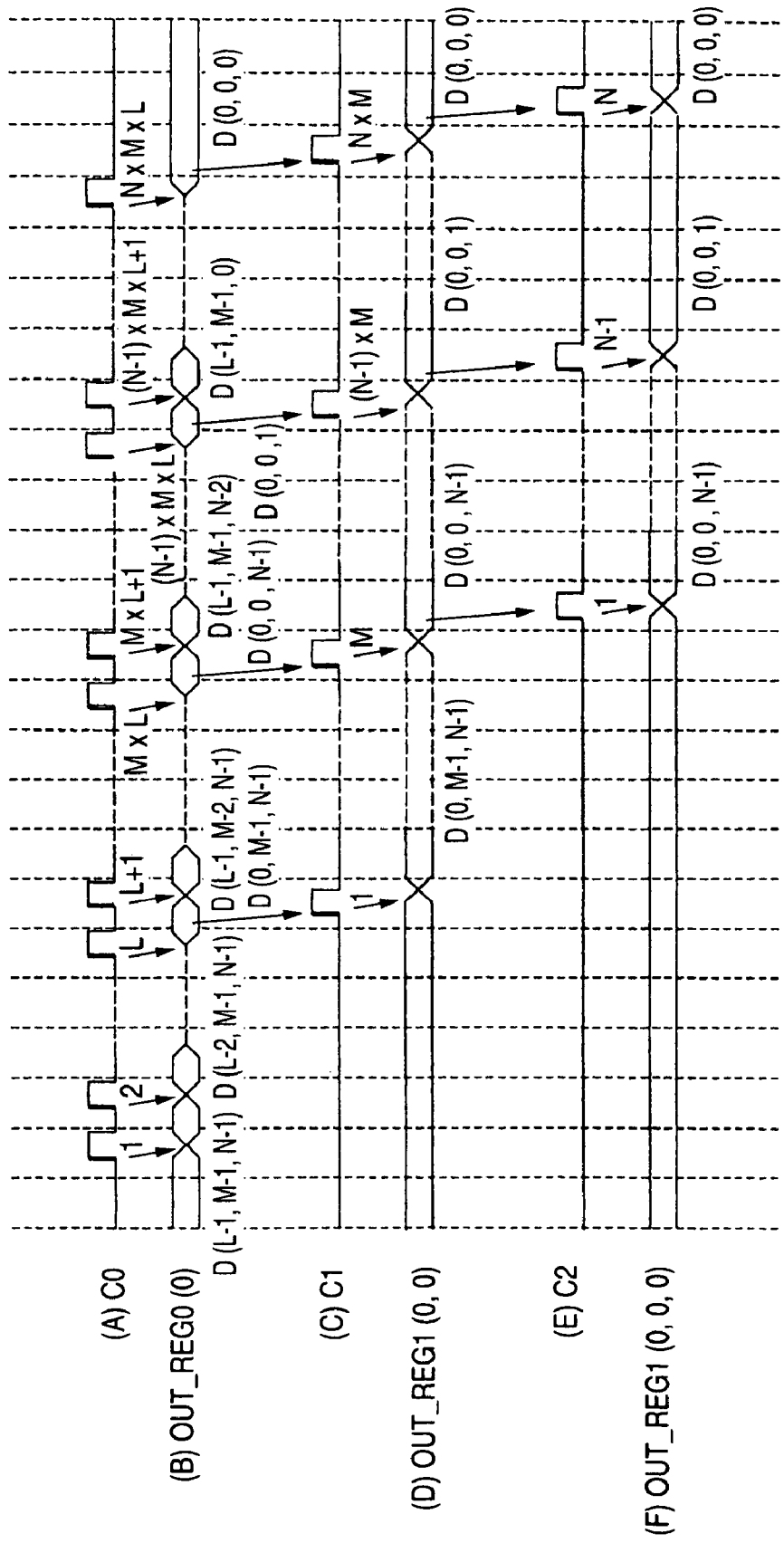
FIG. 21 shows timing charts of the circuit shown in FIG. 20.

(A) to (F) in FIG. 21 show timing charts of the circuit shown in FIG. 20.

In the examples described so far, only reading is considered. However, the similar configuration can configure the circuit for data write.

In FIG. 20, register trains having a three layer structure are shown as an example. In this case, a scan register 201W is configured only of a register REG.

In FIG. 20, as similar to FIG. 9, the number of the scan registers for each one of the uppermost layer, the second layer and the lowermost layer is L, M, and N, respectively.

As shown in (A) to (F) in FIG. 21, the clock C0 is continuously toggled. When the clock C0 is toggled for L times, data desired to write is in all of registers REG0 (*) of the register train 200W-0 in the uppermost layer. Then, the clock C1 is toggled at this time to fetch data into a register REG1 (*, 0) in the second layer.

In addition, when the clock C0 is toggled for L times, data desired to write is in all the registers REG0 (*) in the uppermost layer. Then, the clock C1 is toggled to fetch data into the register REG1 (*, 0) in the second layer. The data originally in the register REG1 (*, 0) is fetched into the REG1 (*, 1). Similarly, the clock C0 is toggled for L*M times in total, data desired to write is in all the registers REG1 (*, *) in the second layer of the register train 200W-1. At this time, the clock C2 is toggled to fetch data into the register REG 2 (*, *, 0) of the register train 200W-2 in the lowermost layer.

Similarly, when the clock C0 is toggled for L*M*N times in total, data desired to write is in all the registers of the register train 200W-2 in the lowermost layer.

Figure 22:
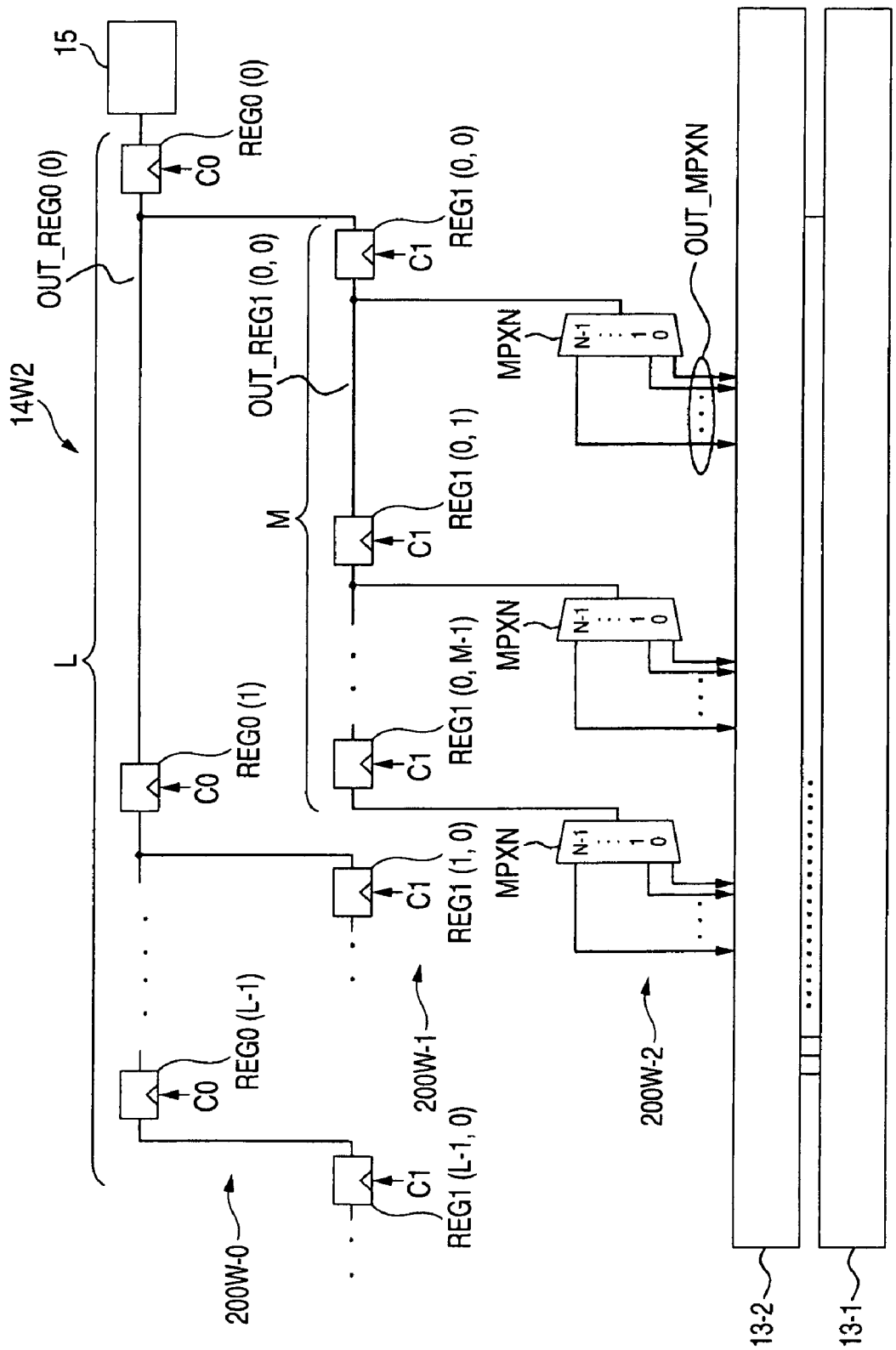
FIG. 22 shows a diagram depicting a second exemplary configuration of the write system of the data transfer circuit according to the embodiment.

FIG. 22 shows a diagram depicting a second exemplary configuration of the write system of the data transfer circuit according to the embodiment.

Figure 23:
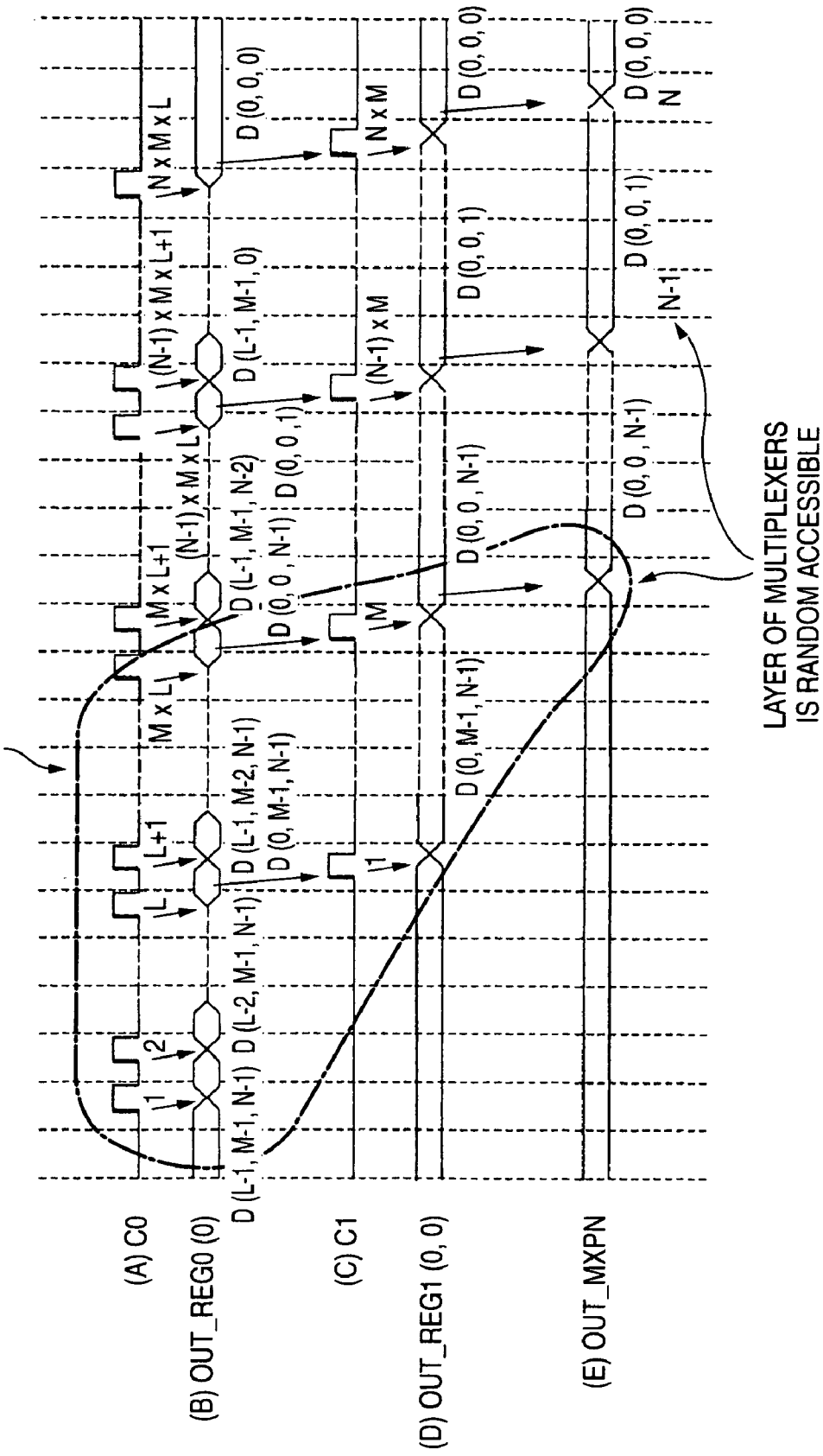
FIG. 23 shows timing charts of the circuit shown in FIG. 22.

(A) to (E) in FIG. 23 show timing charts of the circuit shown in FIG. 22.

The difference of the circuit shown in FIG. 22 from the circuit shown in FIG. 20 is in that multiplexers having multiple inputs are arranged instead of the scan register train in a given layer, and that two buffer memories (page buffer circuits) 13-1 and 13-2 are arranged between the cell array 11 and the multiplexer of the data transfer circuit 14.

When multiplexers MPXN are arranged instead of the scan registers in the lowermost layer train of the data transfer circuit, data is unable to be held in the multiplexer part. Therefore, it is necessary to transfer write data to the buffer memories (page buffer circuits). In order to write data in the cell array even during data transfer, as shown in FIG. 22, it is necessary to provide at least two buffer memories (page buffer circuits) between the cell array 11 and the multiplexers MPXN of the data transfer circuit 14.

In real circuits, the number of the registers in the lowermost layer is the largest and the layout area becomes large, and thus they can be replaced by demultiplexers MPXN having N outputs. In this case, it is necessary to take in the outputs of the demultiplexers on the array side before the update of data of the scan registers in the second layer.

In addition, when the scan register train is used for all the layers, it is necessary for write data transfer to do clock operations the number of which is equivalent to the number of the scan registers between the input/output circuit and the array. When the multiplexers are used, write data transfer can be done for the layer using the multiplexers by the minimum clock operations depending on load and cycle time.

As shown in FIG. 23(A) to (E), this means that when random access is made, the multiplexers are used to reduce the number of clock operations necessary for write data transfer.

Moreover, random access can be made in the layer using the multiplexers. Therefore, random access can be made for each of units of data of a product of the number of the scan registers in each layer even when the scan register train is used in another layer for sequential write data transfer.

On the other hand, for the uppermost layer, the scan registers are used to more reduce the load capacity of the data line than the case of using the multiplexers and to allow high speed operation of data transfer in the uppermost layer including the input/output circuit.

Figure 24:
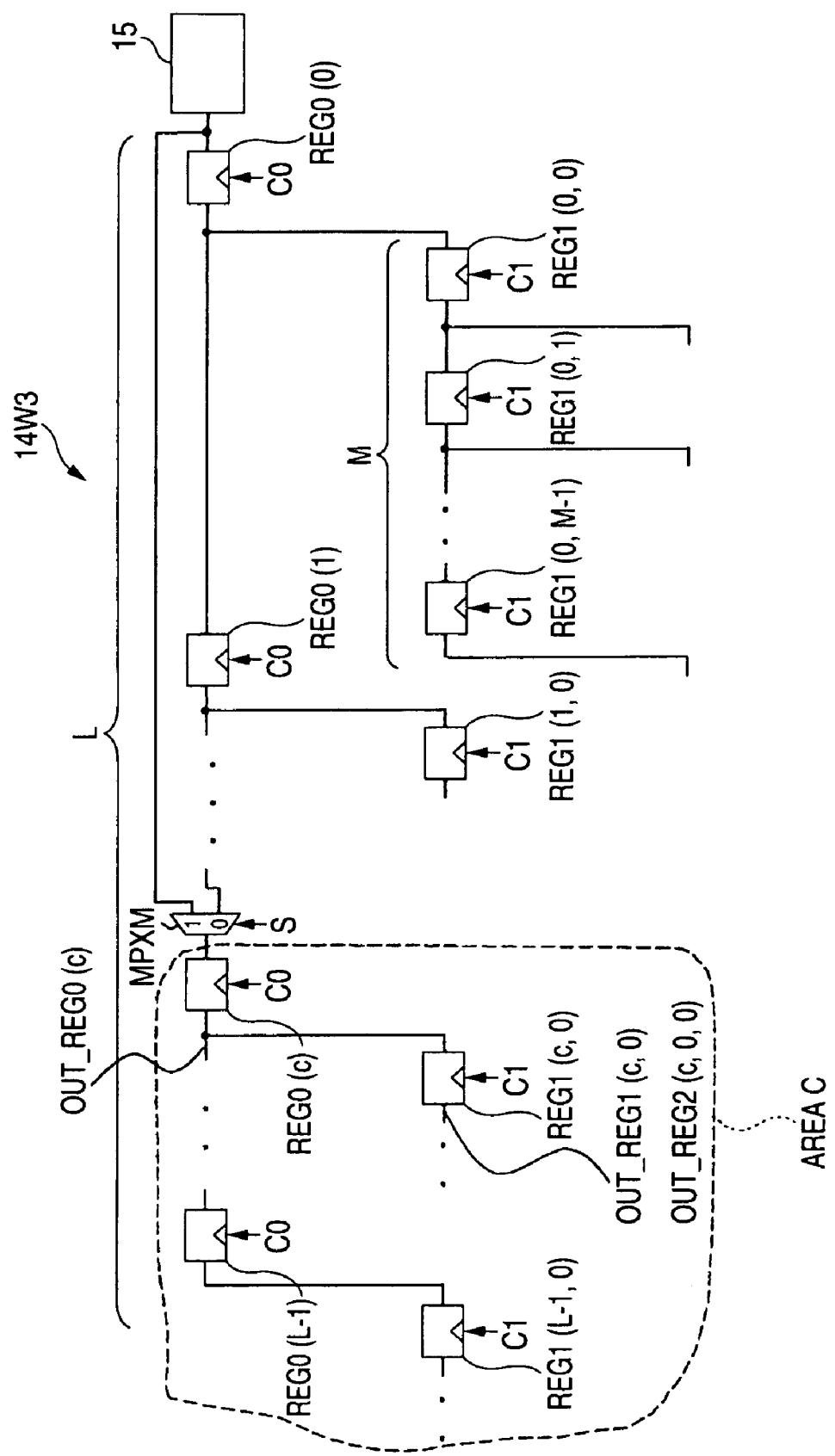
FIG. 24 shows a diagram depicting a third exemplary configuration of the write system of the data transfer circuit according to the embodiment.

FIG. 24 shows a diagram depicting a third exemplary configuration of the write system of the data transfer circuit according to the embodiment.

Figure 25:
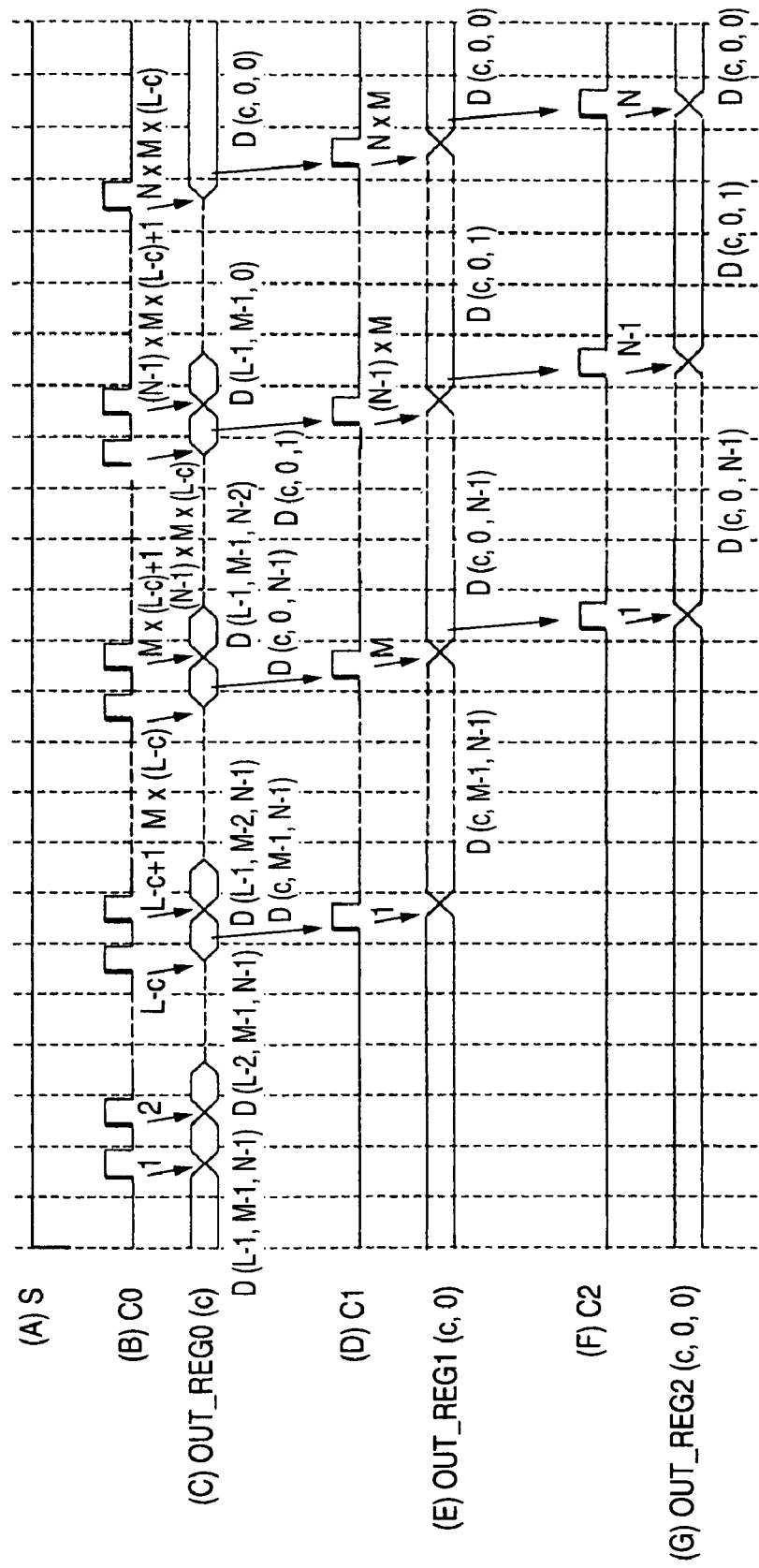
FIG. 25 shows timing charts of the circuit shown in FIG. 24.

(A) to (G) in FIG. 25 show timing charts depicting the circuit shown in FIG. 24.

The difference of the circuit shown in FIG. 24 from the circuit shown in FIG. 20 (or FIG. 22) is in that a multiplexer MPXM is inserted in the midway of a register train, one input of the multiplexer MPXM is connected to the output of an original register, and the other input is connected to the beginning of the register train.

The circuit shown in FIG. 24 can be used when data is desired to write in a certain area in the array earlier. The multiplexer MPXM is inserted before the input of the first register in the area in which data is desired to write earlier (an area C in FIG. 24). In the typical write operation, 0 is given to the selection signal S to write data in the order as described above.

When data is desired to write earlier in the data area C in the drawing, 1 is given to the selection signal S to allow the output of the input/output circuit to be taken in the registers in the area C.

According to the circuit shown in FIG. 24, there is an advantage that data can be written in earlier order as necessary even in the area which is located in the rear part of the register train and in which it takes time to write data in sequential write.

Figure 26:
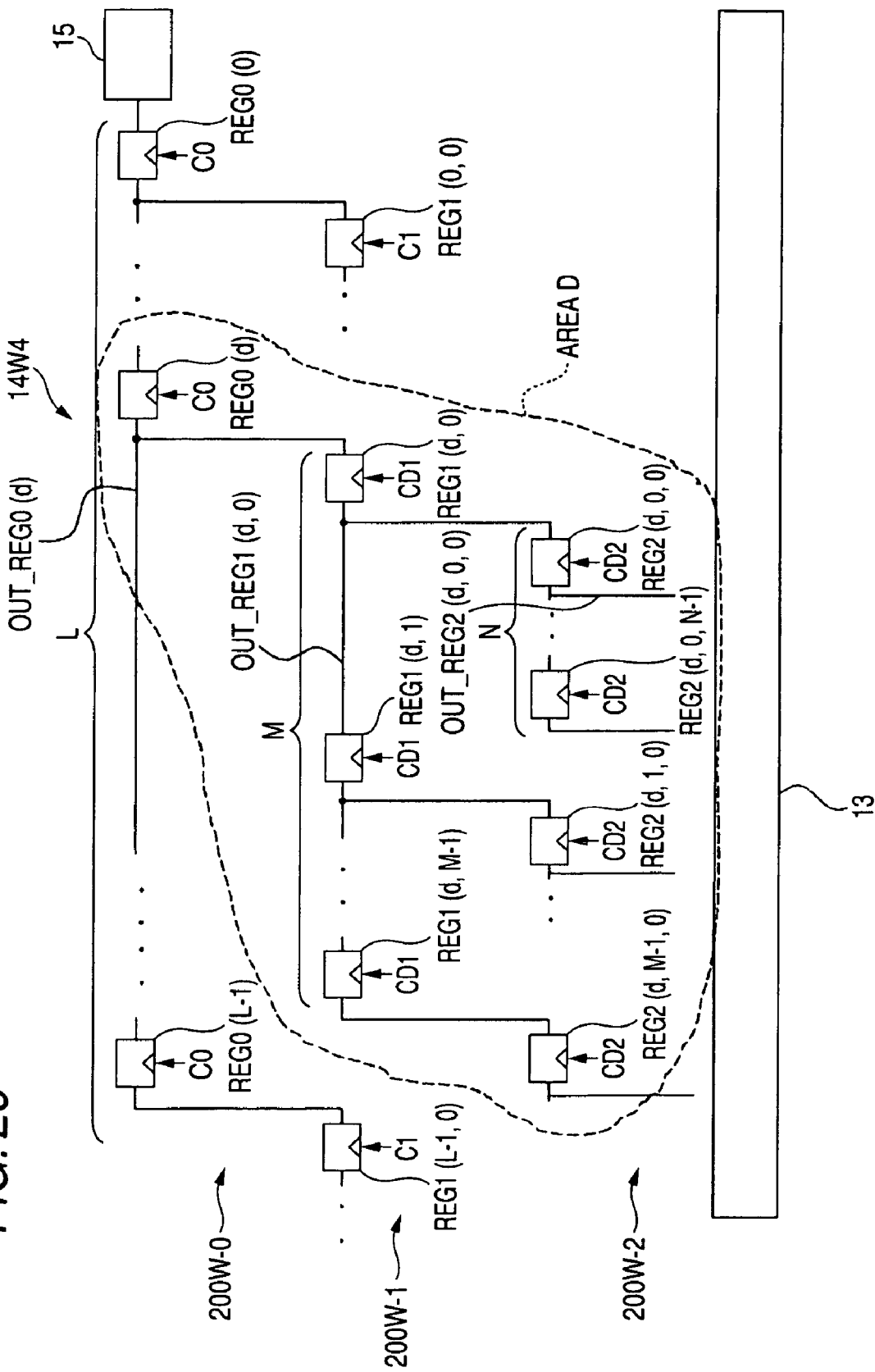
FIG. 26 shows a diagram depicting a fourth exemplary configuration of the write system of the data transfer circuit according to the embodiment.

FIG. 26 shows a diagram depicting a fourth exemplary configuration of the write system of the data transfer circuit according to the embodiment.

Figure 27:
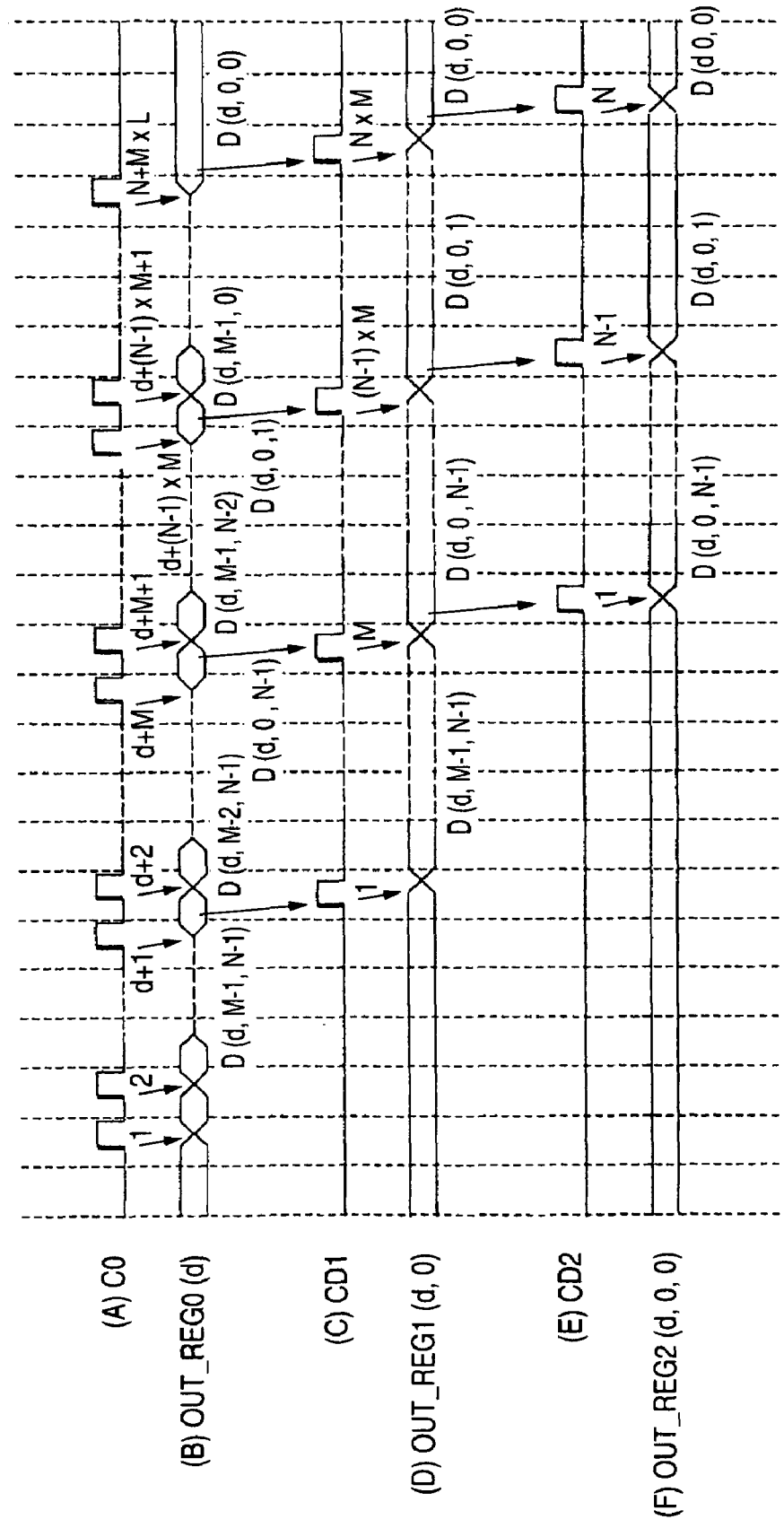
FIG. 27 shows timing charts of the circuit shown in FIG. 26.

(A) to (F) in FIG. 27 show timing charts depicting the circuit shown in FIG. 26.

The circuit configuration shown in FIG. 26 is basically the same as that in FIG. 20, but the control method is different.

As shown in (A) to (F) in FIG. 27, when data is desired to write earlier in an area D in FIG. 26, a clock CD1 is toggled in synchronization with the clock C0 in a register REG1 (d, *) in a register train 200W-1 in the second layer corresponding thereto. In the registers in the second layer, the clock C1 is not toggled other than in the area D. At a point in time when the clock CD1 is toggled for M times, write data going on the uppermost layer is filled in the register train 200W-1 in the second layer in the area D.

After that, a clock CD2 is toggled once in a register train 200W-2 in the lowermost layer in the area D, and then data in the register train 200W-1 in the second layer is taken in the register train 200W-2 in the lowermost layer. At a point in time when the clock CD2 is toggled for N times, all the items of data are written in the area D.

Practically, although it is necessary to toggle the clock C0 by the number of times necessary to advance data from the beginning of the register train 200W-0 in the uppermost layer to the registers in the area D, data can be written in the area D early enough in comparison to that data is in turn written from the beginning.

In addition, here, the case is described in which a single uppermost register is considered as the area D. However, this can be implemented similarly even when the area of a plurality of the scan registers in the uppermost layer is considered as the area for early read.

The control method like this is adapted to freely change the order of writing data when it is desired to write data earlier in a certain lower register train among other trains, not by sequential data write.

Figure 28:
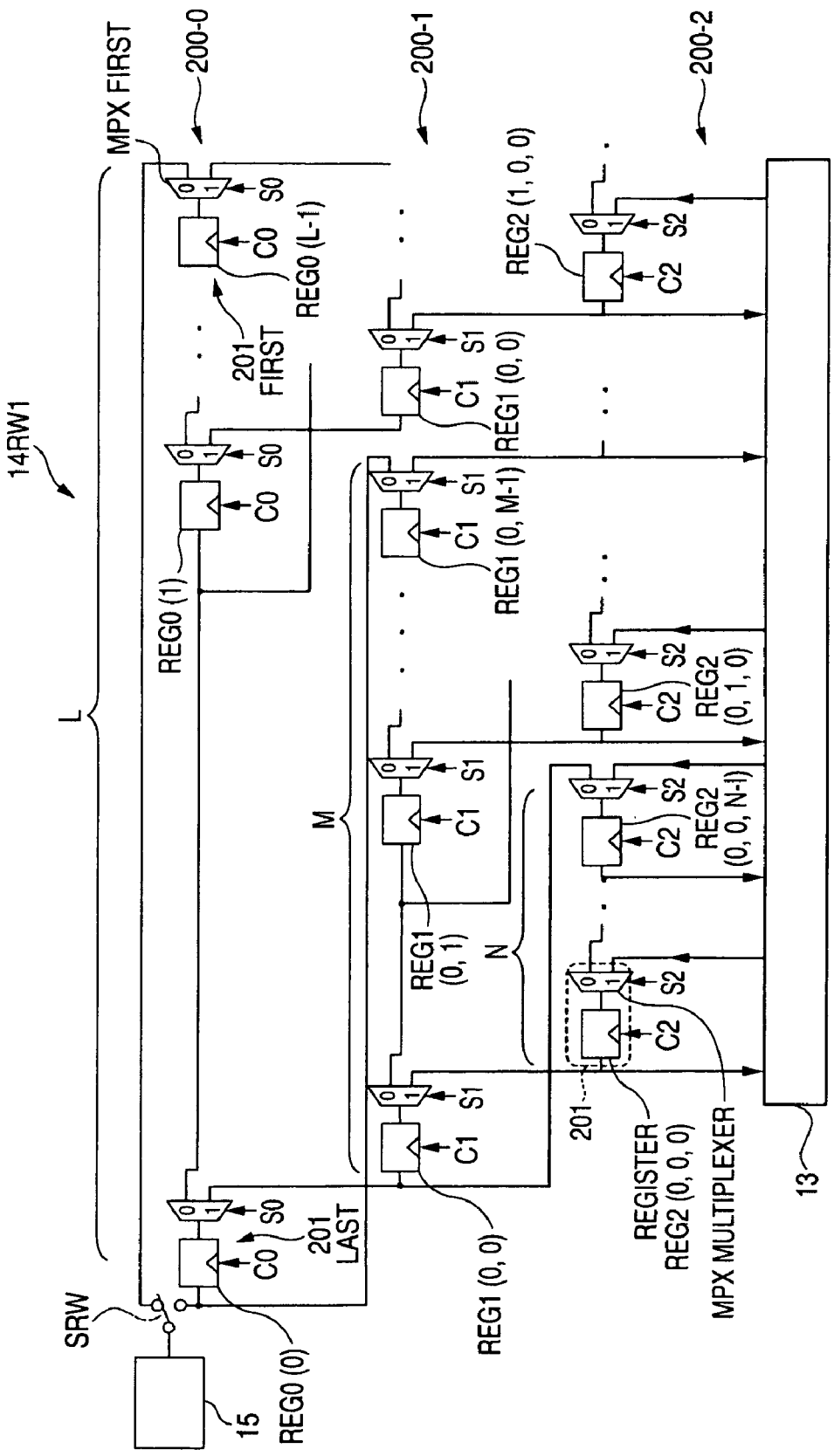
FIG. 28 shows a diagram depicting a first exemplary configuration of a read/write system of the data transfer circuit according to the embodiment.

FIG. 28 shows a diagram depicting a first exemplary configuration of a read/write system of the data transfer circuit according to the embodiment.

A data transfer circuit 14RW1 shown in FIG. 28 is configured to arrange a switch in the output part of the circuit shown in FIG. 9, whereby the circuit meets data transfer in both reading and writing.

In FIG. 28, when read operation is conducted, a switch SRW connected to an input/output circuit 15 is connected to the output part side of a scan register 201last at the last stage (tail) of a scan register train 200 of a scan register train 200RW-0. Except this, data can be read by the method described in FIG. 9.

When write operation is conducted, the switch SRW connected to the input/output circuit 15 is connected to a multiplexer MPXfirst at the first stage input part (the beginning side) of a scan register 201 first of the scan register train 200RW-0, and 0 is given to all of selection signals S0, S1, and S2 of the multiplexer, whereby data can be written by the method described in FIG. 20.

Figure 29:
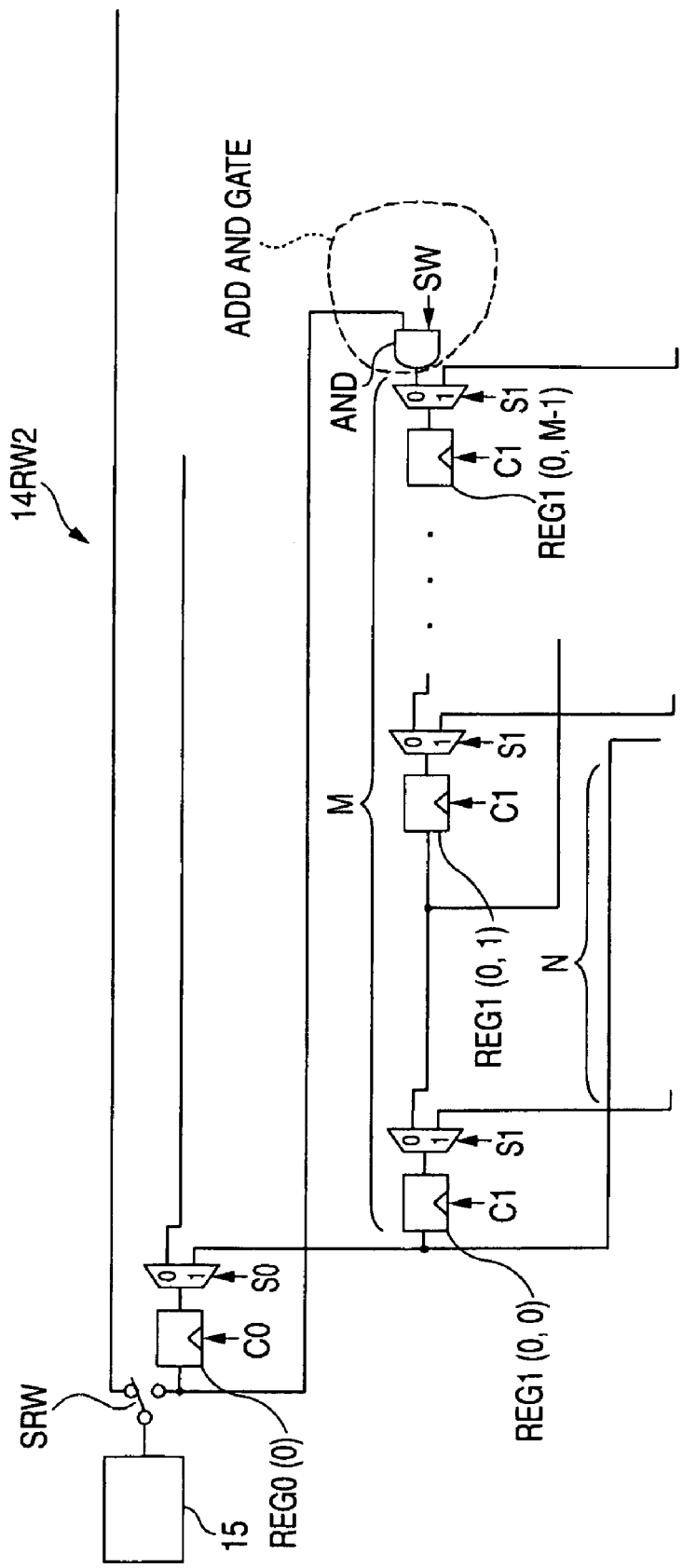
FIG. 29 shows a diagram depicting a second exemplary configuration of the read/write system of the data transfer circuit according to the embodiment.

FIG. 29 shows a diagram depicting a second exemplary configuration of the read/write system of the data transfer circuit according to the embodiment.

In the circuit shown in FIG. 29, when read operation is conducted, an AND gate AND is arranged at the beginning of the scan register train in each layer, 0 is inputted to one input of a switch, and then input data on the input side (the beginning) of the scan register train is set to 0 all the time, whereby unnecessary data inversion can be prevented when data is fetched in synchronization with the clock, and current consumption can be reduced.

When write operation is conducted, 1 is inputted to one input of the AND gate AND to conduct the same operation as described above.

In FIG. 29, the case of the register REG1 (0, M−1) is described, but for the other registers REG1 (*, M−1) and REG2 (*, *, N−1), the similar circuit is inserted.

Figure 30:
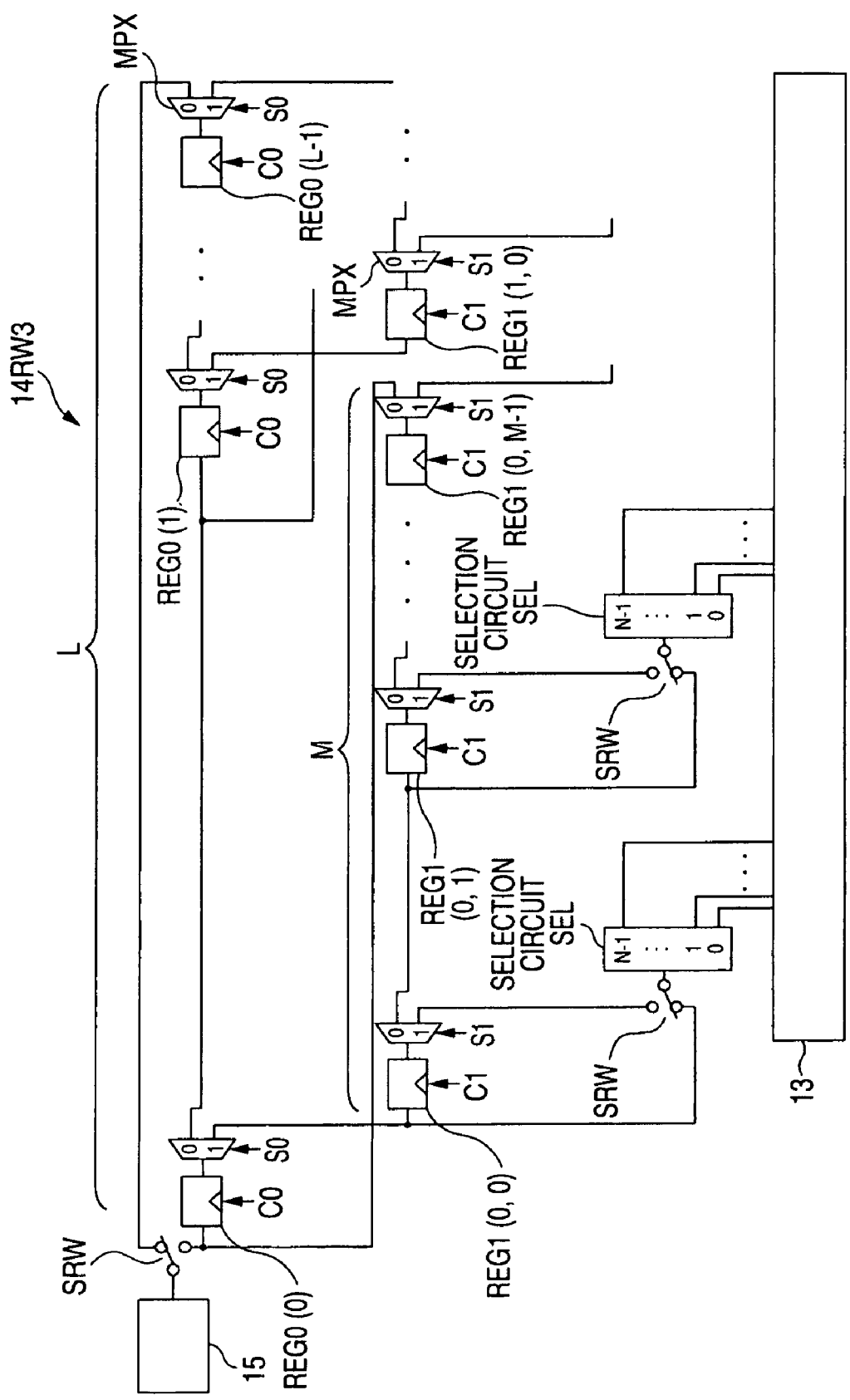
FIG. 30 shows a diagram depicting a third exemplary configuration of the read/write system of the data transfer circuit according to the embodiment.

FIG. 30 shows a diagram depicting a third exemplary configuration of the read/write system of the data transfer circuit according to the embodiment.

In real circuits, since the number of the registers of the scan register train 200RW-2 in the lowermost layer is the greatest and the layout area becomes large, the registers can be replaced by a 1:N selection circuit SEL and a switch SRW.

In this case, in read operation, the switch SRW is switched to the output side of the register in the second layer, and the selection circuit SEL is used to supply subsequent data to the input of the multiplexer in the second layer before the scan registers in the second layer demand new data.

In addition, in write operation, it is necessary that the switch SRW is switched to the input side of the multiplexer in the second layer, and the output of the selection circuit SEL is taken on the array side before the update of data in the scan registers in the second layer.

Figure 31:
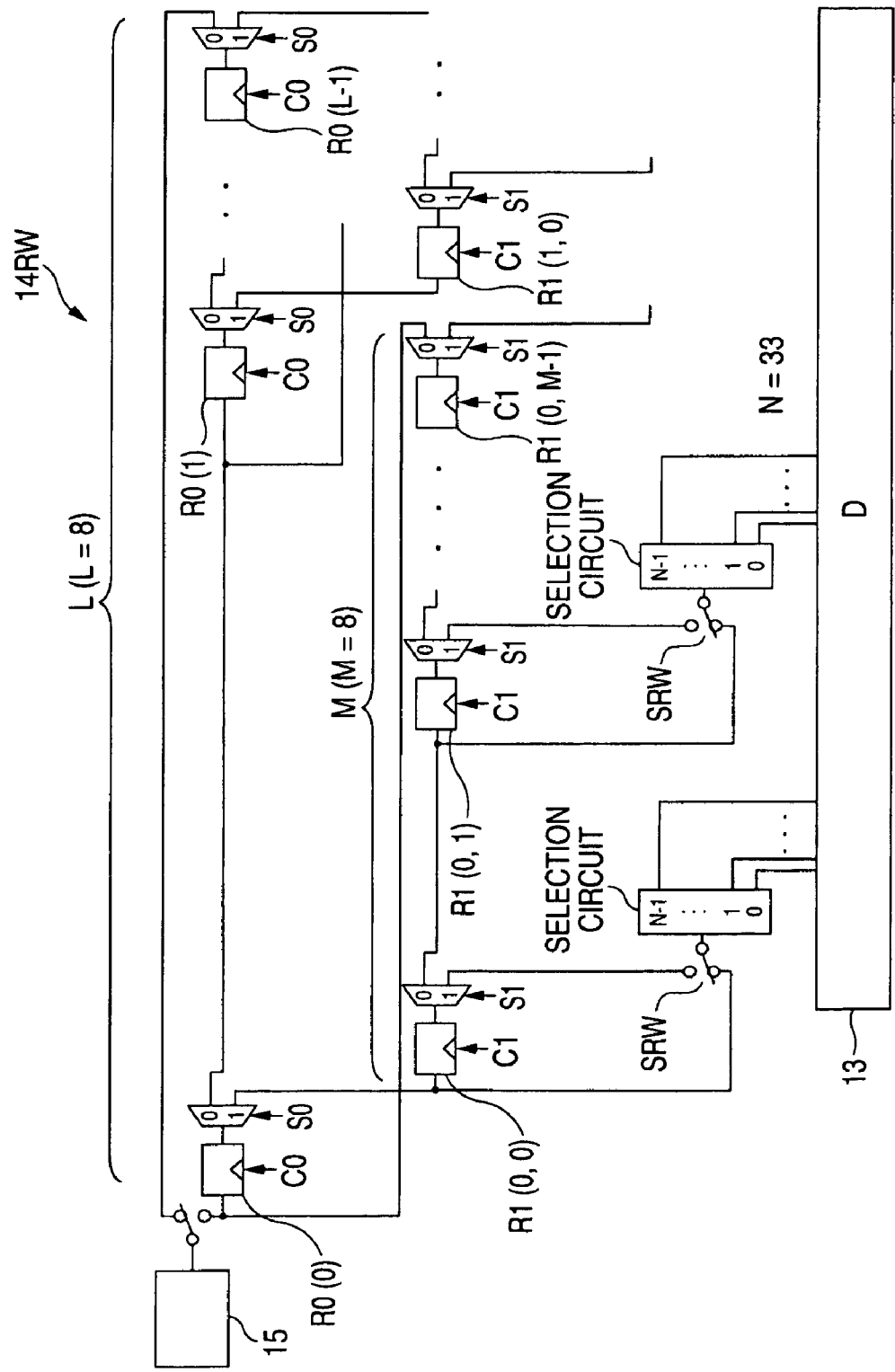
FIG. 31 shows a diagram depicting the read/write system of the data transfer circuit shown in FIG. 30 according to the embodiment where L=M=8, and N=33.

FIG. 31 shows a diagram depicting the read/write system of the data transfer circuit shown in FIG. 30 according to the embodiment where L=M=8, and N=33.

In this example, when the data area has data capacity A (2048 bits) and the redundant area has data capacity B (64 bits), memory bits D (2112 bits)=$2^6 \times 33$. However, the numbers of the scan registers/the multiplexers in the scan register trains in three layers are L=M=8, and N=33(D=L*M*N).

In this case, the clock C0 is toggled for L*M*N times in total in data read and in data write by the methods described in FIGS. 9 and 20, whereby all the items of data can be transferred.

In addition, since the lowermost layer is configured of multiplexers where N=33, random access can be made in units of data where L*M=64, and random access can be made to data at the beginning of the redundant area.

Figure 32:
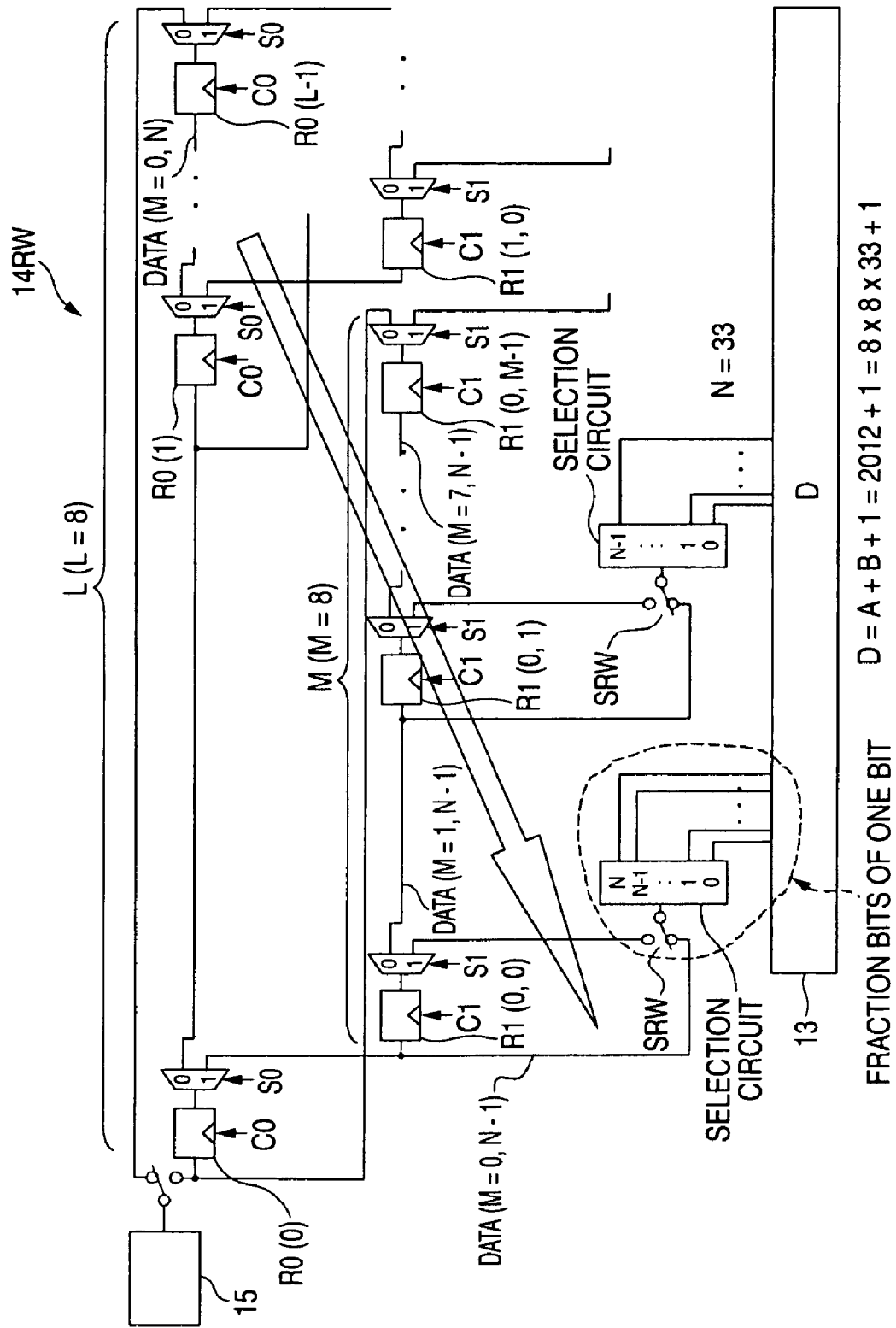
FIG. 32 shows a diagram depicting the read/write system of the data transfer circuit shown in FIG. 30 according to the embodiment where D=L*M*N is not satisfied.

FIG. 32 shows a diagram depicting the read/write system of the data transfer circuit shown in FIG. 30 according to the embodiment where D=L*M*N is not satisfied.

This example is the case where D=L*M*N is not satisfied.

In FIG. 32, fraction data is considered as one bit and the data position is added to the position depicted by a broken line in FIG. 32. In this case, data can be continuously read by 2112+1 bits in data read. In data write, in order to transfer data to the fraction data position, 15 clock cycles (L−1+M) are necessary as extra cycles, because the fraction data (Data (M=0, N)) is at the position in the drawing at the point in time when data of 2012 bits is transferred. This can be avoided by providing the configuration where D=L*M*N is satisfied.

Figure 33:
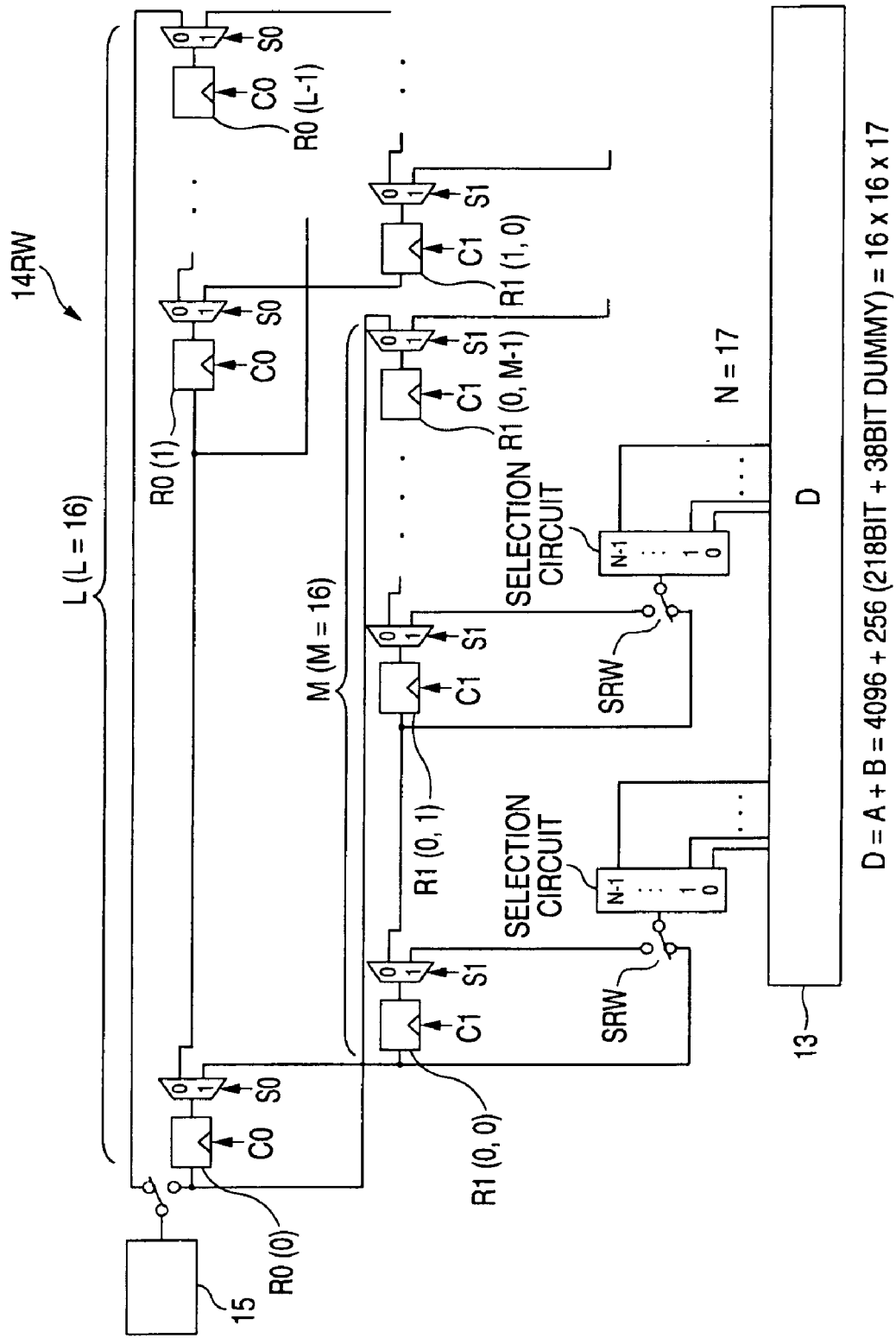
FIG. 33 shows a diagram depicting the read/write system of the data transfer circuit shown in FIG. 30 according to the embodiment where L=M=16, and N=17.

FIG. 33 shows a diagram depicting the read/write system of the data transfer circuit shown in FIG. 30 according to the embodiment where L=M=16, and N=17.

In the example, for example, when the data area has data capacity A (4096 bits) and the redundant area has data capacity B (218 bits), memory bits D (4314 bits)=2×3×719. When a train of 719 scan registers is used for the uppermost layer, current consumption is increased, whereas when the train is used for the lower layer, the layout area is increased (data transfer time is increased when the lower layer is configured to have multiplexers).

Then, as shown in FIG. 33, 38 bits of a dummy data area is added to 4314 bits to be 4352 bits=$2^8 \times 17$ (L=M=16, N=17). Thus, data transfer is made possible at high speed with small current consumption. Furthermore, when the lowermost layer is configured to have multiplexers where N=17, random access can be made in data units of L*M=256, and random access can be made to data at the beginning of the redundant area. However, in this case, since 38 bits of the dummy data area is used, extra data transfer cycles are necessary in writing data in the redundant area as described in association with FIG. 32.

Figure 34:
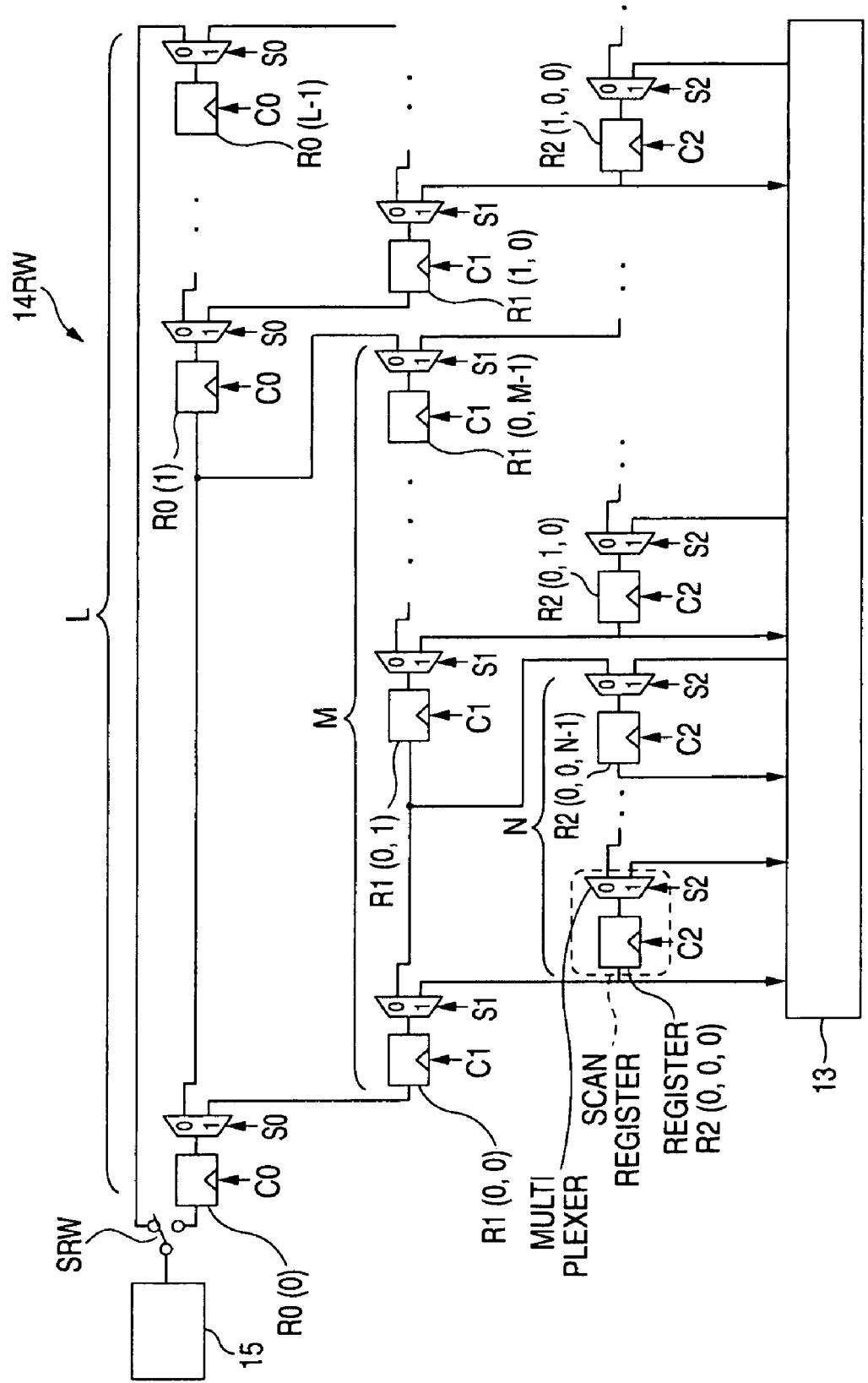
FIG. 34 shows a diagram depicting an exemplary modification of the read/write system of the data transfer circuit shown in FIG. 28 according to the embodiment.

FIG. 34 shows a diagram depicting an exemplary modification of the read/write system of the data transfer circuit according to the embodiment shown in FIG. 28.

In a data transfer circuit 14RW shown in FIG. 34, the output of the shift register one stage before in the scan register train in the uppermost layer is connected to the beginning inputs of the scan register trains R1 and R2, as compared with the example shown in FIG. 28.

As compared with the example shown in FIG. 28, in data write, it is necessary to advance by one clock period the timing to take in data at the beginnings of the scan register trains R1 and R2. However, with this configuration, the length of the signal connection line for writing data from the upper-most layer to the lower layer can be shortened significantly, and current consumption and the signal line can be reduced.

As described above, the exemplary configurations of the data transfer circuit have been described.

Hereinafter, data read and write in the NAND flash memory according to the embodiment will be described.

Figure 35:
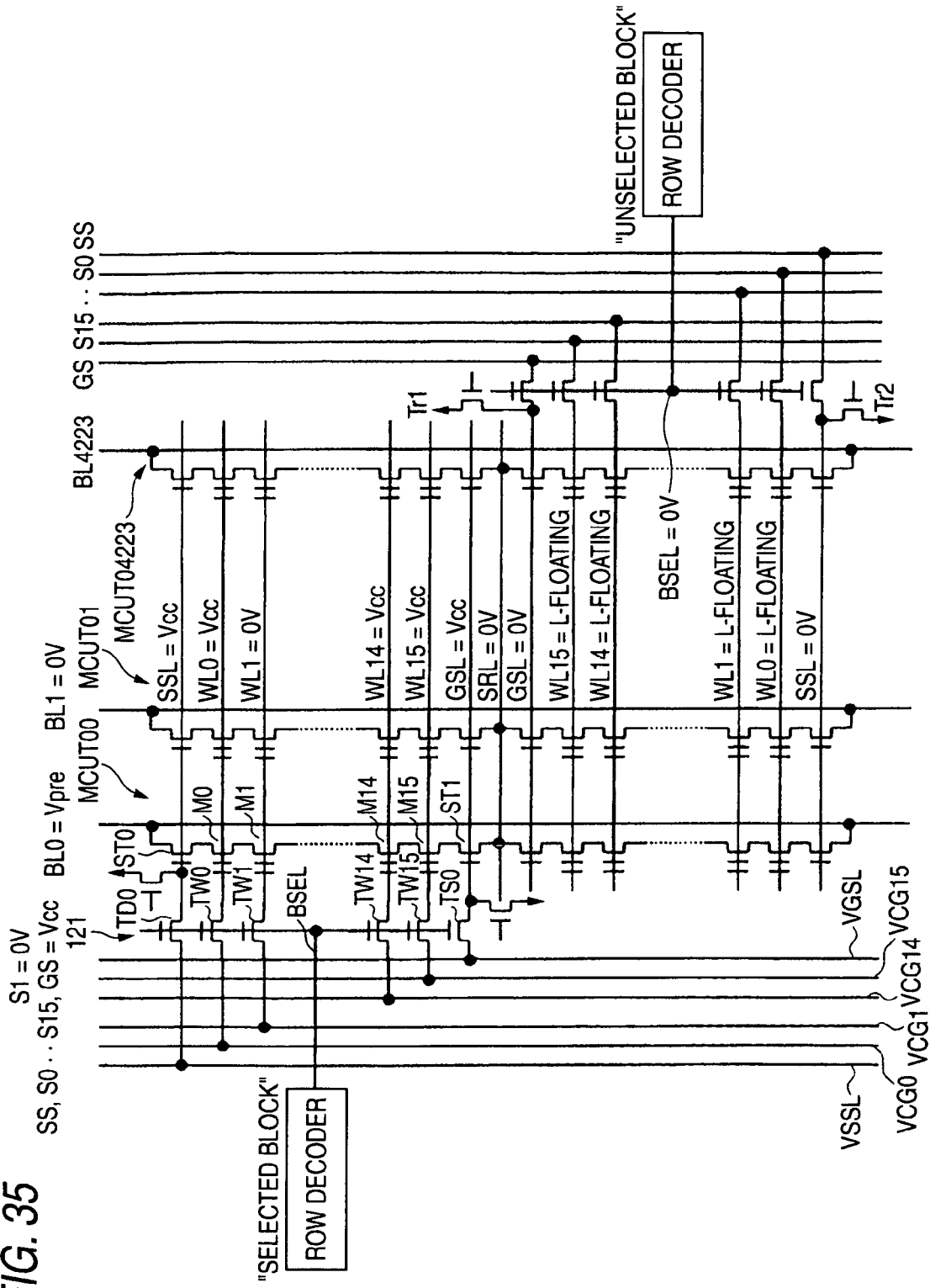
FIG. 35 shows a diagram depicting a cell array part and a row decoder of a NAND flash memory corresponding to that shown in FIG. 3, depicting the bias condition of drive lines when data is read.

FIG. 35 shows a diagram depicting a cell array part and a row decoder of a NAND flash memory corresponding to that shown in FIG. 3, and depicting the bias condition of each of the drive lines when data is read.

In FIG. 35, a selected block and an unselected block are shown.

In this example, bit line shield technique is used for the bit lines in data read in which even numbered and odd numbered bit lines are alternately read. In addition, the related art of the bit line shield technique is disclosed in K. Sakui, et al., "Non-volatile Semiconductor Memory Devices," U.S. Pat. No. 5,453,955, Sep. 25, 1995 (Non-Patent Reference 3).

Figure 36:
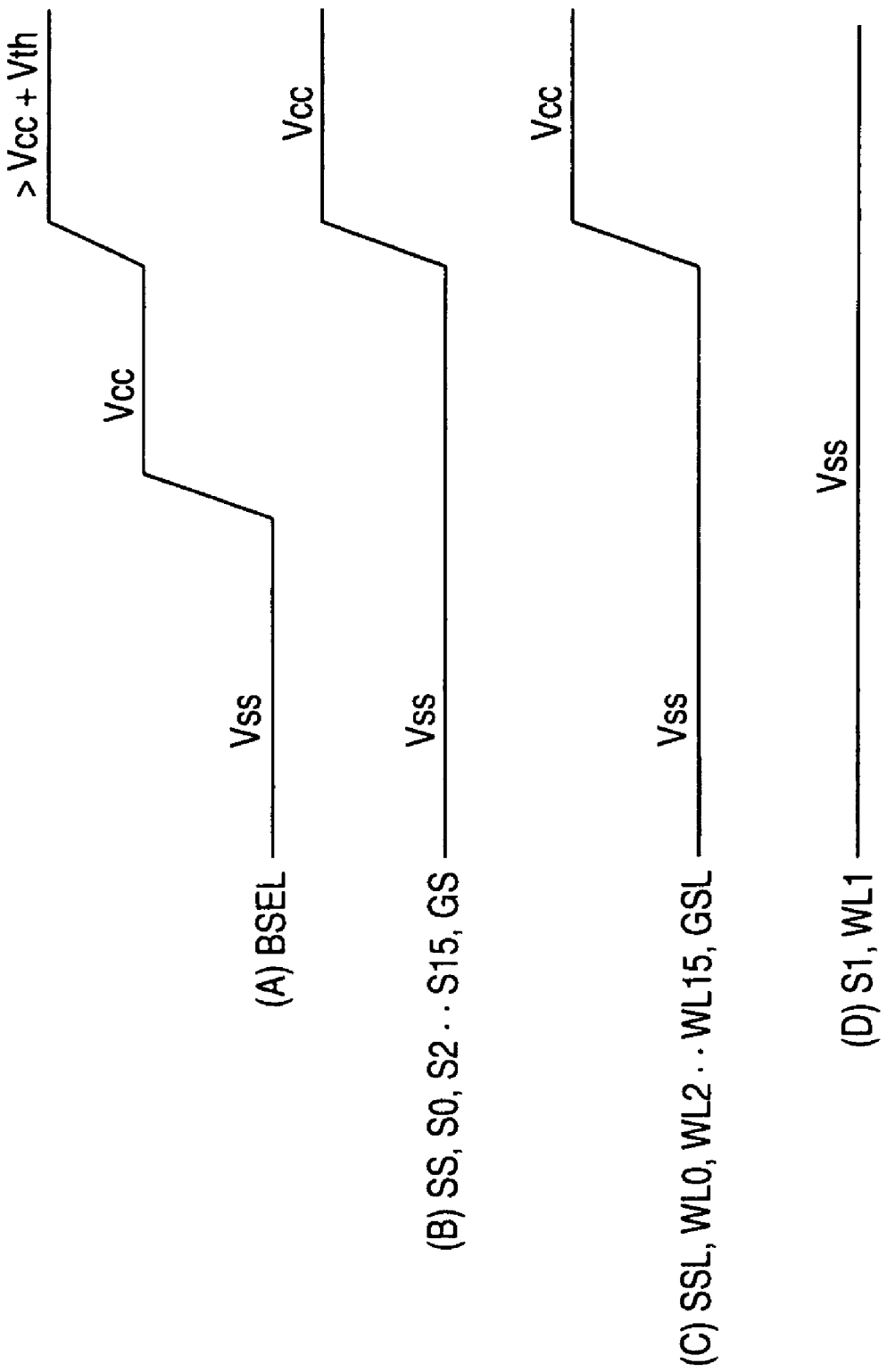
FIG. 36 shows timing charts illustrative of read operation.

(A) to (D) in FIG. 36 show timing charts depicting the essential nodes in read operation in FIG. 35.

In read operation, it is sufficient that the ground voltage Vss=0 V is inputted to a selected word line WL1 in a selected block BLK0, and the single power supply voltage Vcc=3.3 V of external input is inputted to the other word lines WL0, WL2 to WL15 in the selected block and selection gate lines SS and GS in the selected block to which selection gate transistors ST0 and ST1 on the bit line side and the source line side are connected.

Therefore, as shown in (A) to (D) in FIG. 36, the power supply voltage Vcc=3.3 V is charged for preparation at the time when a block selection signal BSEL which drives word line transfer gates TW0 to TW15 is started to read.

Subsequently, word line selection signals S0, S2 to S15 which are applied to drive voltage supply lines VCG0, VCG2 to VCG15 and the drive voltage supply lines VSSL and VGSL and the selection signals SS and GS for the selected gate transistors on the bit line side and the source line side rise from the ground voltage Vss=0 V to the power supply voltage Vcc=3.3 V. In response thereto, the voltage rises to BSEL>Vcc+Vth(=3.3 V+1 V) by intrinsic bootstrap, and the single power supply voltage Vcc=3.3 V of external input is supplied to the other word lines WL0, WL2 to WL15 in the selected block and the selection gate lines SSL and GSL to which the selection gate transistors ST0 and ST1 on the bit line side and the source line side are connected. In addition, the ground voltage 0 V is supplied to the source line SRL.

At this time, the threshold Vth exhibits the threshold voltage of the word line transfer gate, about 1 V.

As described above, in the NAND flash memory according to the embodiment in read operation, data read is conducted at low current consumption without operating the booster circuit. However, the booster circuit defined here does not include intrinsic bootstrap.

Therefore, in a set appliance including a silicon audio player mounted with a NAND flash memory, when a user listens to music with a battery, for example, in the open air, that is, for data read operation out of the NAND flash memory, the single power supply voltage Vcc of external input is used without a booster circuit. Therefore, battery lifetime of the set appliance including a silicon audio player mounted with the NAND flash memory can be prolonged.

In addition, in the set appliance including a silicon audio player mounted with the NAND flash memory, for the operation of recording a favorite piece of music, or erasing an undesired piece of music, that is, for the data rewrite operation to the NAND flash memory, the operation is often conducted with an AC power supply at home, not with a battery, for example, and thus the booster circuit 16 is used.

In the embodiment, data write to the memory cell transistor M1 of the memory cell unit MCUT00 (to MCU T04223) in the block BLK0 is conducted as below.

Figure 37:
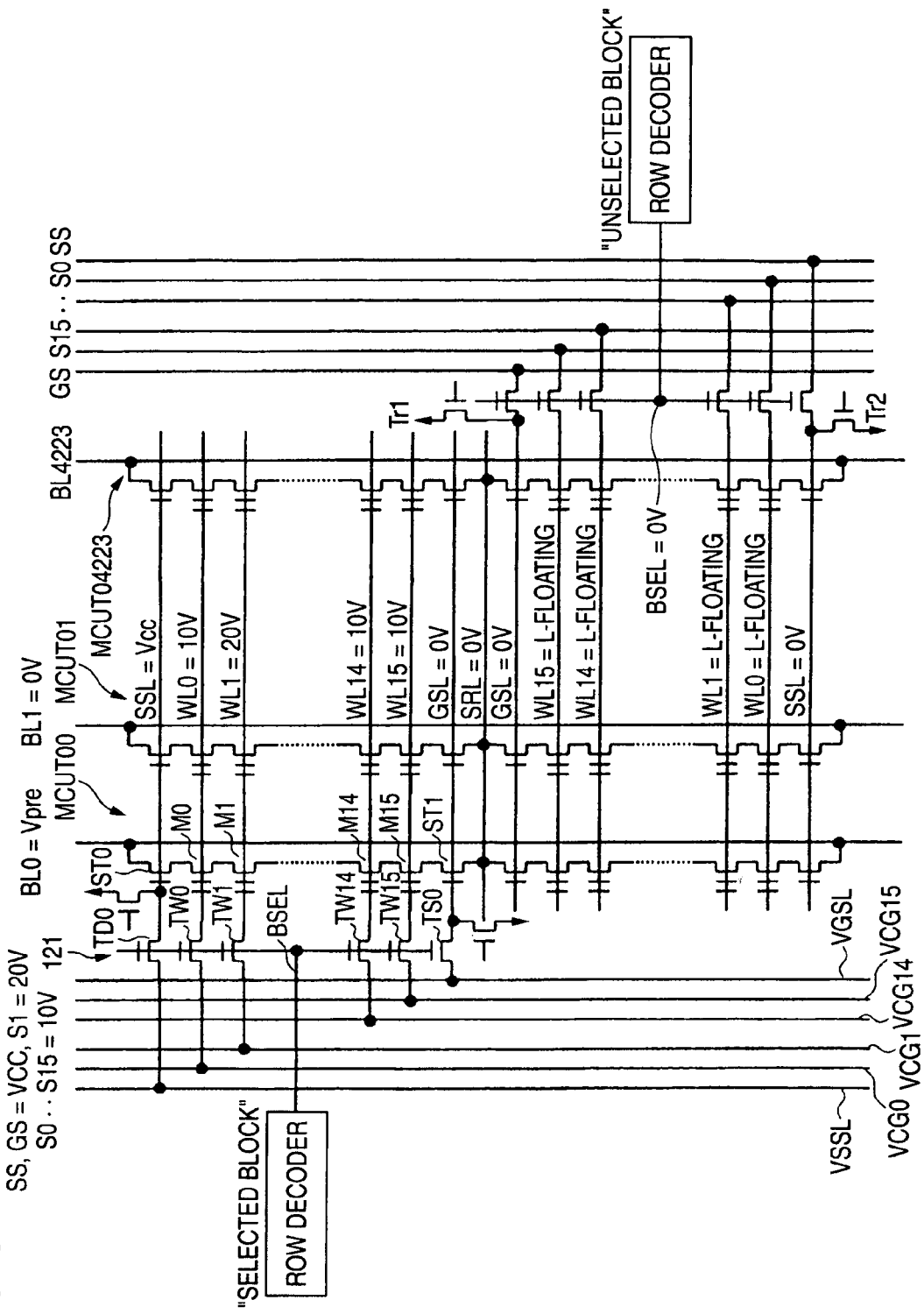
FIG. 37 shows a diagram depicting a cell array part and a row decoder of a NAND flash memory corresponding to that shown in FIG. 3, depicting the bias condition of drive lines when data is written.

In data write, as shown in FIG. 37, the booster circuit 16 supplies high voltage, for example, 20 V to the drive voltage supply line VCG1, and intermediate voltage (for example, 10 V) to the drive voltage supply lines VCG0, VCG2 to VCG15, the power supply voltage Vcc (for example, 3.3 V) to the drive voltage supply line VSSL, and the ground voltage GND (0 V) to the drive voltage supply line VGS.

In addition, the ground voltage GND is applied to the bit line BL0 to which the memory cell unit MCUT00 having the memory cell transistor M1 for data write is connected, and the power supply voltage Vcc is applied to the bit lines BL1, BL0, and BL4223 to which the memory cell units MCUT01 to MCUT04223 having the memory cell transistor M1 for no data write are connected.

Subsequently, the output signal BSEL0 from the block address decoder 20 is outputted at the level of 20V+α only to the portion corresponding to the block BLK0 in the row decoder 12, and the output signals BSEL1 to BSELm from the block address decoder corresponding to the other blocks BLK1 to BLKm are outputted at the level of the ground voltage GND.

Thus, the transfer gates TW0 to TW15, TD0 and TS0 of the transfer gate group 121 corresponding to the block BLK0 are turned to the conductive state, and the transfer gates of the transfer gate groups corresponding to the her blocks BLK1 to BLKm are held in the non-conductive state.

Consequently, the write voltage 20 V is applied to the selected word line WL1, and the pass voltage (intermediate voltage) VpaSS (for example, 10 V) is applied to the unselected word lines WL0, WL2 to WL15.

Thus, the selected gate transistor ST0 in the memory cell units MCUT01 to MCUT04223 is turned to the cutoff state, and the channel part of the memory cell units MCUT01 to MCUT04223 to which the memory cell transistor for no data write is in the floating state. Consequently, the potential of the channel parts is boosted by capacitor coupling to the pass voltage VpaSS mainly applied to the unselected word lines, raising to the voltage for no data write, and data write is forbidden to the memory cell transistor M1 of the memory cell units MCUT01 to MCUT04223.

On the other hand, the channel part of the memory cell unit MCUTOO to which the memory cell transistor for data write is set to the ground voltage Vss (0 V), the potential difference from 20 V of the write voltage applied to the selected word line WL1 allows data to write in the memory cell transistor M1, and the threshold voltage is shifted in the positive direction to about −3 V to 2 V, for example, in the erase state.

In this manner, according to the embodiment, it is unnecessary to operate the booster circuit in data read in the NAND flash memory, and current consumption that basically demands 20 mA as the average current can be reduced to 4 mA, which is about one-fifth. Consequently, battery lifetime is dramatically prolonged to five folds in read operation, and it is without saying that this makes a differentiation technique for set appliance designers. In addition, current consumption can be suppressed for end users, which eventually leads to a reduction in global energy sources.

In addition, according to the embodiment, in semiconductor devices which have the array structure like a memory and an image sensor and read data out of the array, there is a circuit in which the register REG is connected to the multiplexer MPX. The circuit has one or a plurality of scan register trains serially connected in a chain, in which the output of the multiplexer MPX is connected to the input of the register REG, one input of the multiplexer MPX is connected to the output of a register at the next previous stage, wherein the scan register train is used to sequentially read data, and the last output of the lower scan register train is connected to one input of the relevant multiplexer of the scan register train in the layer one layer above. Therefore, when data read operation is conducted, the number of the scan registers to be operated for each of the clocks can be reduced, and high speed data transfer and low current consumption can be implemented.

In addition, such the structure is provided in which a multiplexer is inserted into the tail of the scan register train, one input of the multiplexer is connected to the output of the tail of the original scan register train, and the other input thereof is connected to the output of the scan register at the forward stage in the scan register train. Therefore, data can be read in earlier order as necessary even though the data is in the area which is located in a forward position in the scan register train and it takes time to read data by sequential data read.

In addition, such the structure is provided in which sequential data read is not conducted, the clock for the scan register is controlled whether to drive the clock for each of the lower scan register trains, and the multiplexers in the upper layer scan register train is controlled so as to collectively fetch the output of the lower scan registers in the upper layer scan register train in the lower scan register train. Therefore, when it is desired to read data in a certain lower scan register train earlier than data in other trains, elements are so controlled to freely change the order to read data.

In addition, in the semiconductor device which has the array structure like a memory and an image panel and writes data in the array, there is a circuit which has a plurality of layers of the register trains having a plurality of the registers REG serially connected in a chain, the register train is used to sequentially write data write, and the output of each of the registers in the upper layer register train is connected to the input of the lower layer register train. Therefore, when data write operation is conducted, the number of the scan registers to be operated for each of the clocks can be reduced, and high speed data transfer and low current consumption and can be implemented.

In addition, such the structure is provided in which a multiplexer is inserted into the midway of a register train, one input of the multiplexer is connected the output of an original register, and the other input thereof is connected to the beginning of the register train. Therefore, data can be written in earlier order as necessary even though the data is in the area which is located in a backward position in the scan register train and it takes time to read data by sequential data read.

In addition, such the structure is provided in which sequential data write is not conducted, the clock for the scan register is controlled whether to drive the clock for each of the lower scan register trains. Therefore, when it is desired to write data in a certain lower scan register train earlier than data in other trains, elements are so controlled to freely change the order to read data.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a cell array having cells for data storage arranged in an array;
   a plurality of buffers configured to latch read data from the cell array in units of pages;
   an output circuit configured to output read data; and
   a data transfer circuit configured to sequentially transfer read data in units of pages latched in the buffer to the output circuit,
   wherein the data transfer circuit includes:
   at least one scan register train, each of the at least one scan register train including plurality of serially connected scan registers, each of the scan registers being operated at every clock cycle;
   each scan register in a given scan register train including a register and a multiplexer, in each scan register, an output of the multiplexer is connected to an input of the register, and an input of the multiplexer is connected to an output of a previous scan register in the given scan register train.

2. The according to claim 1, further comprising:
   a plurality the scan register trains arranged in layers, where a lower layer scan register train is arranged closer to the cell array relative to an upper layer scan register train and the lowermost layer scan register train is closest to the cell array, and the uppermost layer scan register train is farthest from the cell array,
   wherein a last output of a lower layer scan register train is connected to one input of a multiplexer in an upper layer scan register train one layer farther from the cell array than the lower layer scan register train,
   in each scan register in a lowermost layer scan register train, the other input of the multiplexer is connected to a data output line of a buffer from the plurality of buffers, and
   an output of the uppermost layer scan register train is connected to an input of the output circuit.

3. The semiconductor device according to claim 2, wherein the data transfer circuit further comprises
   a multiplexer having multiple inputs arranged between a pair of scan register trains or between the lowermost scan register train and the cell array.

4. The semiconductor device according to claim 3, wherein the data transfer circuit further comprises:
   an output multiplexer,
   one input of the output multiplexer being connected to an output of a last scan register in a given scan register train, and
   the other input of the output multiplexer being connected to an output of a scan register in the given scan register train other than the last scan register.

5. The semiconductor device according to claim 3, further comprising:
   a control part configured to control a clock for the scan registers in a first scan register train, and to control an output multiplexer,
   wherein a first input of the output multiplexer is connected to the last scan register in the first scan register train, and a second input of the output multiplexer is connected to a last scan register in a second scan register train.

6. The semiconductor device according to claim 3,
   wherein the semiconductor device stores a data block including user data and auxiliary data, and is configured to sequentially output the user data and the auxiliary data, wherein at least one part of the auxiliary data is stored in the semiconductor device so as to be capable of being output earlier than the user data.

7. The semiconductor device according to claim 2, wherein the data transfer circuit further comprises:
an output multiplexer,
one input of the output multiplexer being connected to an output of a last scan register in a given scan register train, and
the other input of the output multiplexer being connected to an output of a scan register in the given scan register train other than the last scan register.

8. The semiconductor device according to claim 7, further comprising:
a control part configured to control a clock for the scan registers in a first scan register train, and to control an output multiplexer
wherein a first input of the output multiplexer is connected to the last scan register in the first scan register train, and a second input of the output multiplexer is connected to a last scan register in a second scan register train.

9. The semiconductor device according to claim 2, further comprising:
a control part configured to control a clock for the scan registers in a first scan register train, and to control an output multiplexer,
wherein a first input of the output multiplexer is connected to the last scan register in the first scan register train, and a second input of the output multiplexer is connected to a last scan register in a second scan register train.

10. The semiconductor device according to claim 2,
wherein the semiconductor device stores a data block including user data and auxiliary data, and is configured to sequentially output the user data and the auxiliary data,
wherein at least one part of the auxiliary data is stored in the semiconductor device so as to be capable of being output earlier than the user data.

11. A semiconductor device comprising:
a cell array having cells for data storage arranged in an array;
a plurality of buffers configured to latch write data of the cell array in units of pages;
an input circuit configured to input write data; and
a data transfer circuit configured to sequentially transfer write data inputted in the input circuit to the buffer,
wherein the data transfer circuit includes:
a plurality of layers of register trains, each scan register train including plurality of serially connected scan registers,
wherein an output of each of the scan registers in an upper layer scan register train is connected to an input of a lower layer scan register train, where a lower layer scan register train is arranged closer to the cell array relative to an upper layer scan register train.

12. The semiconductor device according to claim 11, further comprising a layer of
multi-output demultiplexers connected to a register train.

13. The semiconductor device according to claim 12,
wherein a given scan register train includes a multiplexer inserted into the middle of thereof,
one input of the inserted multiplexer is connected to an output of a scan register in the given scan register train, and
the other input of the inserted multiplexer is connected to an input of the given scan register train.

14. The semiconductor device according to claim 12, further comprising:
a control part configured to control a clock for the scan registers in at least one of the scan register trains.

15. The semiconductor device according to claim 11,
wherein a given register train includes a multiplexer inserted into the middle of thereof,
one input of the inserted multiplexer is connected to an output of a scan register in the given scan register train, and
the other input of the inserted multiplexer is connected to an input of the given scan register train.

16. The semiconductor device according to claim 11, further comprising:
a control part configured to control a clock for the scan registers in at least one of the scan register trains.

17. A semiconductor device comprising:
a cell array having cells for data storage arranged in an array;
a plurality of buffers configured to latch read data and write data of the cell array in units of pages;
an input/output circuit configured to output read data and to input write data; and
a data transfer circuit configured to sequentially transfer read data in units of pages latched in the buffer to the input/output circuit and to sequentially transfer write data inputted in the input/output circuit to the buffer,
wherein the data transfer circuit includes:
a plurality of layers of scan register trains, each scan register train including a plurality of serially connected scan registers, each scan register being operated at every clock cycle,
the plurality the layers of scan register trains being arranged where a lower register train is arranged closer to the cell array relative to an upper register train,
each scan register in each of the scan register trains including a register and a multiplexer, in each scan register, an output of the multiplexer is connected to an input of the register, and an input of the multiplexer is connected to an output of a previous scan register in the scan register train, and
a last output of a lower scan register train is connected to one input of an input multiplexer in a scan register train in an upper layer , one layer farther from the cell array, and one input of a multiplexer in a lower scan register train is connected to an output of a register in a scan register train in the upper layer scan register train.

18. The semiconductor device according to claim 17, further comprising:
a control part configured to control a clock for the scan registers in a first register train, and to control an output multiplexer, wherein a first input of the output multiplexer is connected to the last scan register in the first scan register train, and a second input of the output multiplexer is connected to a last scan register in a second scan register train.

19. The semiconductor device according to claim 17, further comprising
a selection circuit having multiple inputs arranged between a pair of scan register trains or between the lowermost scan register train and the cell array.

20. The semiconductor device according to claim 19,
wherein the data transfer circuit has a array structure in which the number of memories to read and write data in the cell array at one time is matched with a product of the number of scan registers in each of a plurality of layers of scan register trains.

21. The semiconductor device according to claim 19,
wherein the data transfer circuit has a redundant area that is open for use in a data block in which data is read from the cell array and written therein at one time,
wherein if a data capacity of an original data area is A, and a data capacity of the redundant area is B, when the number of scan registers in a lowermost layer is LN, a sum of the data capacity of the data area and the redundant area is matched with a product of the number of scan registers as expressed by an equation below, where the number of scan registers in an uppermost layer is L1, the number of scan registers in a layer right under is L2, and so on,

A+B=L1*L2* ... *LN.

22. The semiconductor device according to claim 17,
wherein the data transfer circuit has a array structure in which the number of memories to read and write data in the cell array at one time is matched with a product of the number of scan registers in each of a plurality of layers of scan register trains.

23. The semiconductor device according to claim 17,
wherein the data transfer circuit has a redundant area that is open for use in a data block in which data is read from the cell array and written therein at one time,
wherein if a data capacity of an original data area is A, and a data capacity of the redundant area is B, when the number of scan registers in a lowermost layer is LN, a sum of the data capacity of the data area and the redundant area is matched with a product of the number of scan registers as expressed by an equation below, where the number of scan registers in an uppermost layer is L1, the number of scan registers in a layer right under is L2, and so on, A+B=Lt*L2* ... *LN.

24. The semiconductor device according to claim 23 or 21,
wherein when the number of memories to read and write data in the cell array at one time reaches $2^n \times P$, the data transfer circuit has a scan register train having $P \times 2^m$ of scan registers wherein n is an integer equal to or greater than one, P is an odd number, and m is an integer equal to or greater than zero on the lowermost layer among a plurality of layers of scan register trains.

25. The semiconductor device according to claim 23 or 21,
wherein when it is difficult that the scan register numbers L1, L2, ... LN are formed in relatively uniform layers, the data transfer circuit adds a pseudo-dummy data area to A+B, whereby the scan register numbers are formed in layers.

26. A data storage apparatus comprising:
a main storage medium configured to include a semiconductor device; and
a control circuit configured to store in the semiconductor device a data block in which internally created management data is added to user data received from a host,
wherein the semiconductor device of the main storage medium includes:
a cell array having cells for data storage arranged in an array;
a plurality of buffers configured to latch read data of the cell array in units of pages;
an output circuit configured to output read data; and
a data transfer circuit configured to sequentially transfer read data in units of pages latched in the buffer to the output circuit,
the data transfer circuit includes:
a plurality of layers of scan register trains arranged where a lower register train is arranged closer to the cell array relative to an upper register train, the lowermost layer register train is closest to the cell array, and the uppermost layer register train is farthest from the cell array,
each of the scan register trains
a plurality of serially connected scan registers, each scan register being operated at every clock cycle, and
each scan register in the scan register train including a register and a multiplexer, in each scan register, an output of the multiplexer is connected to an input of the register, and a first input of the multiplexer is connected to an output of a previous scan register in the scan register train,
a last output of a lower scan register train is connected to a second input of a multiplexer in a scan register train in an upper layer one layer farther from the cell array,
a second input of a multiplexer in each scan register train in the lowermost layer of register trains is connected to a data output line of a buffer from the plurality of buffers, and
an output of a scan register train in the uppermost layer is connected to an input of the output circuit,
wherein a data block having management data added is read as a sequential word train out of the semiconductor memory, and
in the data block, at least one part of the management data is arranged in an area in which data is output earlier than the user data is outputted.

27. The data storage apparatus according to claim 26, further comprising
a multiplexer having multiple inputs arranged between a pair of scan register trains or between the lowermost scan register train and the cell array.

* * * * *